United States Patent
Xiao et al.

(10) Patent No.: US 8,884,363 B2
(45) Date of Patent: Nov. 11, 2014

(54) SYSTEM AND METHOD FOR INTEGRATED CIRCUITS WITH CYLINDRICAL GATE STRUCTURES

(75) Inventors: De Yuan Xiao, Shanghai (CN); Guo Qing Chen, Shanghai (CN); Roger Lee, Shanghai (CN); Chin Fu Yen, Shanghai (CN); Su Xing, Shanghai (CN); Xiao Lu Huang, Shanghai (CN); Yong Sheng Yang, Shanghai (CN)

(73) Assignees: Semiconductor Manufacturing International (Shanghai) Corp., Shanghai (CN); Semiconductor Manufacturing International (Beijing) Corp., Beijing (CN)

( * ) Notice: Subject to any disclaimer, the term of this patent is extended or adjusted under 35 U.S.C. 154(b) by 292 days.

(21) Appl. No.: 12/892,881

(22) Filed: Sep. 28, 2010
(Under 37 CFR 1.47)

(65) Prior Publication Data
US 2011/0291190 A1 Dec. 1, 2011

(30) Foreign Application Priority Data

Sep. 28, 2009 (CN) .......................... 2009 1 0057965

(51) Int. Cl.
*H01L 29/66* (2006.01)
*H01L 29/423* (2006.01)
*H01L 29/06* (2006.01)
*B82Y 10/00* (2011.01)
*H01L 29/78* (2006.01)
*H01L 29/786* (2006.01)

(52) U.S. Cl.
CPC ...... *H01L 29/7854* (2013.01); *H01L 29/42392* (2013.01); *H01L 29/66795* (2013.01); *H01L 29/0673* (2013.01); *H01L 29/0665* (2013.01); *B82Y 10/00* (2013.01); *H01L 29/78696* (2013.01)
USPC ..................... 257/331; 257/E21.635; 438/283

(58) Field of Classification Search
CPC ......................... H01L 29/66795; H01L 29/785
USPC .................. 257/331, 401, E21.442, E21.635; 438/164, 283
See application file for complete search history.

(56) References Cited

U.S. PATENT DOCUMENTS

| | | | | |
|---|---|---|---|---|
| 4,729,001 | A * | 3/1988 | Haskell | 257/345 |
| 7,268,024 | B2 * | 9/2007 | Yeo et al. | 438/151 |
| 7,452,778 | B2 * | 11/2008 | Chen et al. | 438/283 |
| 8,101,473 | B2 * | 1/2012 | Cho et al. | 438/164 |

FOREIGN PATENT DOCUMENTS

CN 101740618 A 6/2010

\* cited by examiner

*Primary Examiner* — David Vu
(74) *Attorney, Agent, or Firm* — Kilpatrick Townsend & Stockton LLP

(57) ABSTRACT

A system and method for integrated circuits with surrounding gate structures are disclosed. The integrated circuits system includes a transistor having a gate all around cylindrical (GAAC) nanowire channel with an interposed dielectric layer. The cylindrical nanowire channel being in a middle section of a semiconductor wire pattern connects the source and drain region positioned at the two opposite end sections of the same wire pattern. A method is provided for manufacturing the integrate circuits system with a GAAC transistor including forming an SOI layer wire pattern on the buried oxide layer of an SOI wafer; forming a cavity underneath the middle section of the wire pattern and shaping the middle section to cylindrically shaped channel; forming a gate electrode surrounding the cylindrical channel region with an interposed gate dielectric layer, the gate electrode being positioned on the buried oxide layer vertically towards the wire pattern; forming the source/drain regions at the two opposite end sections of the wire pattern on either sides of the gate electrode and channel.

21 Claims, 36 Drawing Sheets

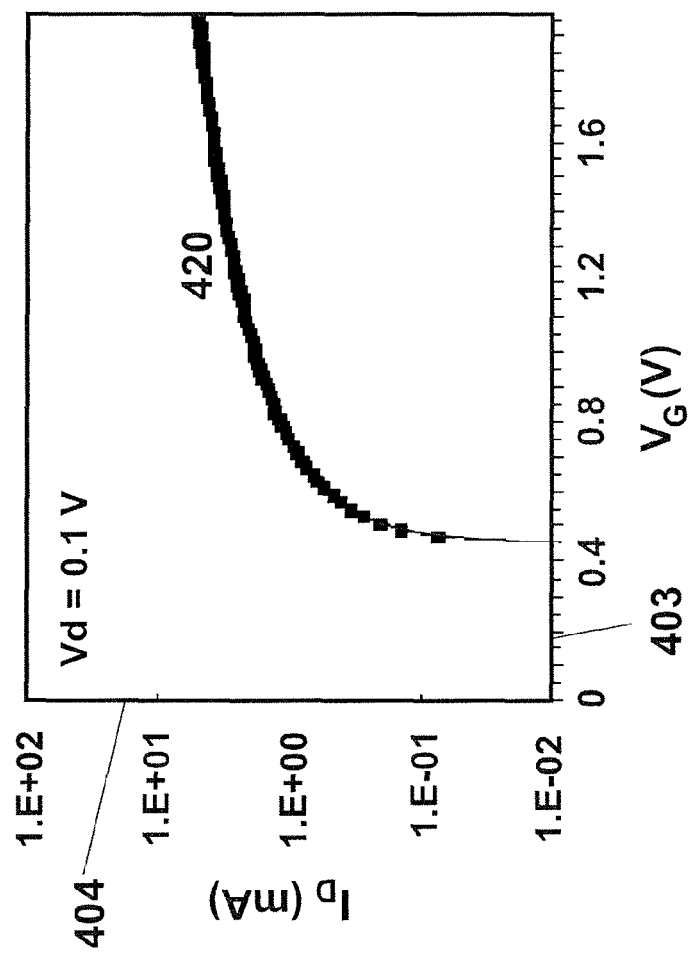

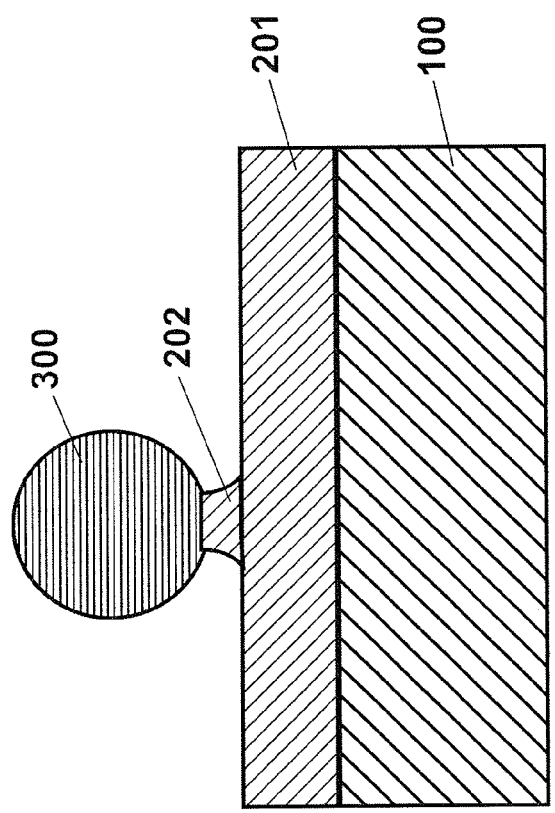

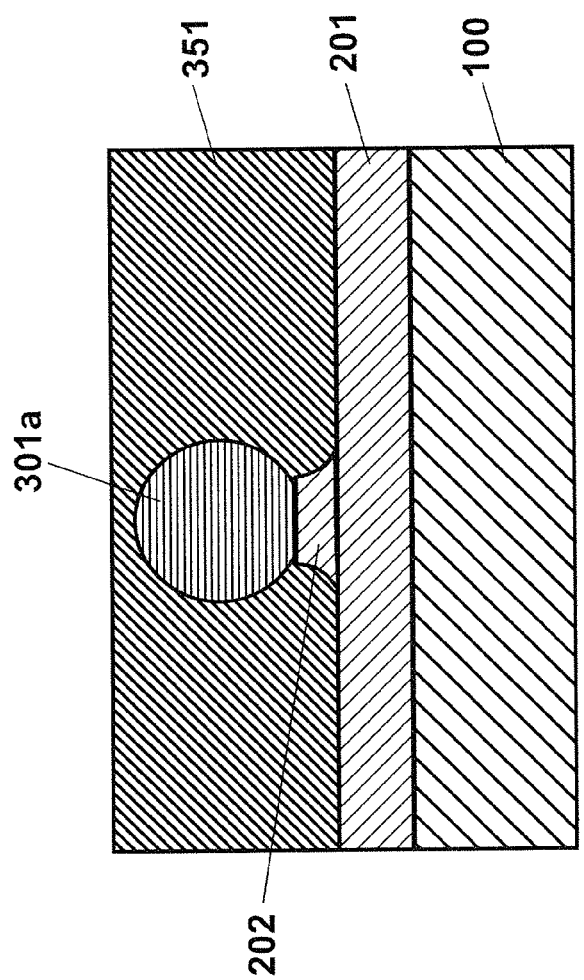

SYSTEM AND METHOD FOR INTEGRATED CIRCUITS WITH CYLINDRICAL GATE STRUCTURES

CROSS-REFERENCES TO RELATED APPLICATIONS

This application claims priority to Chinese Patent Application No. 200910057965.3, filed Sep. 28, 2009, by inventors De Yuan Xiao et al., commonly assigned and incorporated by reference herein for all purposes.

BACKGROUND OF THE INVENTION

The present invention is directed to integrated circuits and their processing for the manufacture of semiconductor devices. More particularly, the invention provides a semiconductor device having a transistor and a method for fabrication thereof. Merely by way of example, the invention has been applied to a field effect transistor (FET) device having a gate-all-around cylindrical (GAAC) nanowire. As an example, the FET is based on a silicon-on-insulator (SOI) wafer substrate and method for the manufacture thereof. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility.

However, making devices smaller is very challenging, as each process used in IC fabrication may have certain limits. That is to say, a given process typically only works down to a certain feature size, and then either the process or the device layout needs to be changed. An example of such a limit is that for CMOS processes and technology at reduced gate lengths conventional CMOS device have increasing difficulty in maintaining high drive currents with low off-current leakage and threshold voltage stability as well. The short-channel effect becomes a big hurdle to further scale down the conventional CMOS devices. This results in a degradation of the device performance and determines the limits of minituralization. Over the past, various conventional techniques have been developed to overcome the above-mentioned limits. Unfortunately, these techniques have often been inadequate.

Therefore, it is desirable to have an improved gate structure for MOS devices and processes thereof.

BRIEF SUMMARY OF THE INVENTION

The present invention is directed to integrated circuits and their processing for the manufacture of semiconductor devices. More particularly, the invention provides a semiconductor device having a transistor and a method for fabrication thereof. Merely by way of example, the invention has been applied to a field effect transistor (FET) device having a gate-all-around cylindrical (GAAC) nanowire. As an example, the FET is based on a silicon-on-insulator (SOI) wafer substrate and method for the manufacture thereof. But it would be recognized that the invention has a much broader range of applicability.

As used herein, the term "semiconductor wire" or "semiconductor nanowire," refers to an elongated semiconductor region. These terms are used interchangeably in this disclosure.

A specific embodiment of the invention provides a semiconductor device having a gate-all-around cylindrical nanowire architecture. The semiconductor device includes a substrate, a first insulation layer overlaying the substrate, and an elongated semiconductor region, or a semiconductor wire, overlying the first insulation layer along a first direction. The semiconductor wire includes a first end section, a middle section, and a second end section. The semiconductor device further includes a source region within the first end section and a drain region within the second end section. Additionally, the semiconductor device includes a channel region within the middle section a channel region being within the middle section. The channel region connects the source region and the drain region. The channel region is characterized by a substantially cylindrical shape having a radius and a length. The semiconductor device further includes a second insulation layer surrounding the cylindrical channel region. Moreover, the semiconductor device includes a gate electrode overlaying the second insulation layer all around the channel region and overlaying the first insulation layer along a second direction which is substantially perpendicular to the first direction.

Another embodiment of the invention provides a transistor with a gate surrounding a cylindrical nanowire channel. The transistor includes a substrate, a first insulation layer overlaying the substrate, and a semiconductor wire overlying the first insulation layer along a first direction. The semiconductor wire includes a first end section, a middle section, and a second end section. The transistor further includes a source region within the first end section and a drain region within the second end section. Additionally, the transistor includes a channel region within the middle-section connecting the source region and the drain region. The channel region is characterized by a substantially cylindrical shape having a radius and a length. The transistor further includes a second insulation layer wrapped around the channel region. Moreover, the transistor includes a gate electrode surrounding the second insulation layer all around the channel region and overlaying the first insulation layer along a second direction. The second direction being substantially perpendicular to the first direction. The gate electrode is associated with a gate length along the first direction substantially equal to the length of the channel. Furthermore, the transistor includes a first spacer region and a second spacer region. The first spacer region is in contact with the gate electrode, the second insulation layer, the source region, and the first insulation layer. The second spacer region is in contact with the gate electrode, the second insulation layer, the drain region, and the first insulation layer.

Yet another embodiment of the invention provides a method for fabricating a semiconductor device. The method includes providing a first insulation layer on a wafer substrate and forming a semiconductor wire overlying the first insulation layer along a first direction. The semiconductor wire includes a first end section, a middle section, and a second end section. The method further includes forming an undercut structure of the first insulation layer beneath the semiconductor wire and removing the undercut structure selectively beneath the middle section to form a cavity having a first length and a first height. Additionally, the method includes forming a channel region by shaping the middle section above the cavity to a substantially cylindrical shape. The channel region is associated with a channel length substantially equal to the first length. The method further includes wrapping a second insulation layer around the cylindrical channel region. The second insulation layer has a thickness substantially less than the first height of the cavity. Moreover, the method includes depositing a conductive layer on the first insulation layer to at least cover the semiconductor wire including the cylindrical channel region surrounded by the second insulation layer and to fill the cavity beneath. The method includes further forming a gate region from the conductive layer along a second direction surrounding the cylindrical channel region including the filled cavity beneath. The second direction is substantially perpendicular to the first direction. The gate region is associated with a gate length along the first direction which is substantially equal to the first length. Furthermore, the method includes forming a source region in the first end section and forming a drain region in the second end section.

Yet another embodiment of the invention provides a method of making a transistor with a gate all around a cylindrical nanowire channel. The method includes providing an SOI substrate including an SOI layer, a buried oxide layer and a bottom substrate, and forming a wire pattern within the SOI layer on the buried oxide layer along a first direction. The wire pattern includes a first end section, a middle section, and a second end section. The method further includes forming an undercut structure of the buried oxide layer underneath the wire pattern and selectively removing the undercut structure underneath the middle-section to form a cavity having a first length and a first height. Additionally, the method includes forming a channel region by shaping the middle section above the cavity to a substantially cylindrical shape. The channel region is associated with a channel length substantially equal to the first length. The method further includes forming a gate dielectric layer at least around the cylindrical channel region. The gate dielectric layer has a thickness substantially less than the first height of the cavity. The method further includes depositing a conductive layer on the buried oxide layer to at least cover the wire pattern including the channel region surrounded by the gate dielectric layer and to fill the cavity underneath. Moreover, the method includes forming a gate region from the conductive layer along a second direction surrounding the cylindrical channel region including the filled cavity underneath. The second direction is substantially perpendicular to the first direction. The gate region is associated with a gate length along the first direction which is substantially equal to the first length Furthermore, the method includes forming a source region in the first end-section and a drain region in the second end-section. The method further includes forming a first spacer region and a second spacer region. The first spacer region is in contact with the gate region, the source region, the gate dielectric layer, and the buried oxide layer; and the second spacer region is in contact with the gate region, the drain region, the gate dielectric layer, and the buried oxide layer.

In still another embodiment, a method for forming a semiconductor devices includes providing a semiconductor layer overlying an insulator layer and forming an elongated semiconductor region in the semiconductor layer using an anisotropic semiconductor etching process. The method includes etching the insulating layer using an isotropic dielectric etching process, forming a mask to protect a first portion and a second portion of the elongated semiconductor region and expose a third portion of the elongated semiconductor region, and removing a portion of the insulator layer under the third portion of the elongated semiconductor region to form a void region. The method also includes forming a dielectric layer overlying the elongated semiconductor region and forming a conductive material overlying the dielectric layer over the elongated semiconductor region, the conductive material completely surrounding the third portion of the elongated semiconductor region. The method further includes patterning the conductive material.

In some embodiments, the method also includes using an isotropic dielectric etch process to form undercuts under the elongated semiconductor region. In another embodiment, the semiconductor layer overlying the insulator layer is provided providing on a silicon-on-insulator (SOI) substrate. In yet another embodiment, the method also includes thermal oxidation of the elongated semiconductor region and isotropic oxide etch to cause the elongated semiconductor region to have a rounded cross-section. In another embodiments, an isotropic dielectric etch is used for removing a portion of the insulator layer under the third portion of the semiconductor region. In a specific embodiment, a buffered oxide etchant (BOE) is used for removing a portion of the insulator layer under the third portion of the semiconductor region.

In some embodiments, the method also includes an $H_2$ annealing process for forming a cylindrical-shaped semiconductor region. In an embodiment, the $H_2$ annealing process is carried out at about 1000 to 1200° C. In another embodiment, the cylindrical-shaped semiconductor region has a diameter of from about 2 nm to about 25 nm. In another embodiment, forming the dielectric layer comprises forming a high-K dielectric layer. In an embodiment, forming the conductive material includes forming a polysilicon material. In another embodiment, the method also includes forming ONO (Oxide/Nitride/Oxide) spacers adjacent to the patterned conductive material.

It is to be appreciated that various embodiments of the present invention provide a semiconductor device having a gate-all-around cylindrical nanowire architecture and a method of fabrication thereof. Among other things, this invention can be particularly applied for reducing the problems of the conventional multi-gate fin field effect transistor (finFET) and improving the device performance and the scale down capability. According to certain embodiments of the present invention, the gate-all-around cylindrical (GAAC) nanowire finFET shows many benefits over convention multi-gate finFET including GAA rectangular (GAAR) type finFET. With gate-all-around cylindrical nanowire architecture the transistor is controlled by essentially infinite number of gates surrounding the entire cylinder-shaped channel. For example, the electrical integrity within the channel is improved by reducing the leakage current due to the non-symmetrical field accumulation such as corner effect. Additionally, the present invention provides a fabrication method for making device having gate-all-around cylindrical nanowire architecture. The method is characterized by its simplicity and full compatibility with conventional planar CMOS technology.

It is to be understood that the present invention has a wide range of applicability. For example, certain embodiments are compatible with existing system and processes. Depending upon application, various embodiments of the present invention may be readily modified.

Various additional features and advantages of embodiments of the present invention can be more fully appreciated with reference to the detailed description and accompanying drawings that follow.

BRIEF DESCRIPTION OF THE DRAWINGS

FIG. 5B is a simplified diagram showing drain current as a function of gate voltage for a gate-all-around cylindrical nanowire finFET device with a drain voltage of 0.1V according to an embodiment of the present invention;

FIGS. 7B, 8B, 9B, 10B, 11B, 12B, 13B, and 14B are simplified cross-sectional views taken along the A-A' plane of FIGS. 7A, 8A, 9A, 10A, 11A, 12A, 13A, and 14A respectively;

DETAILED DESCRIPTION OF THE INVENTION

The present invention is directed to integrated circuits and their processing for the manufacture of semiconductor devices. More particularly, the invention provides a semiconductor device having a transistor and a method for fabrication thereof. Merely by way of example, the invention has been applied to a field effect transistor (FET) device having a gate-all-around cylindrical (GAAC) nanowire. As an example, the FET is based on a silicon-on-insulator (SOI) wafer substrate and method for the manufacture thereof. But it would be recognized that the invention has a much broader range of applicability.

As discuss above, various conventional techniques have been developed for FET devices. For example, to fabricate devices beyond current scaling limits, alternative gate stack materials, band engineering methods, and alternative transistor structures are all explored rigorously. It has been studied that for FET the single gate full-depleted single-gate SG-FD device cannot be scaled as short as a channel length as dual-gate (DG) fin type FET device, which is due to the fact that there is no field confinement with a single gate conducting plane. Unfortunately, the dual-gate finFET does not confine the field completely. Naturally multi-gate finFET devices are developed as a better choice in terms of both low off-current leakage and short-channel effect immunity. The multi-gate finFET device also is feasible to scale down with high speed, low power dissipation, low short channel effects, etc.

Figure 1:
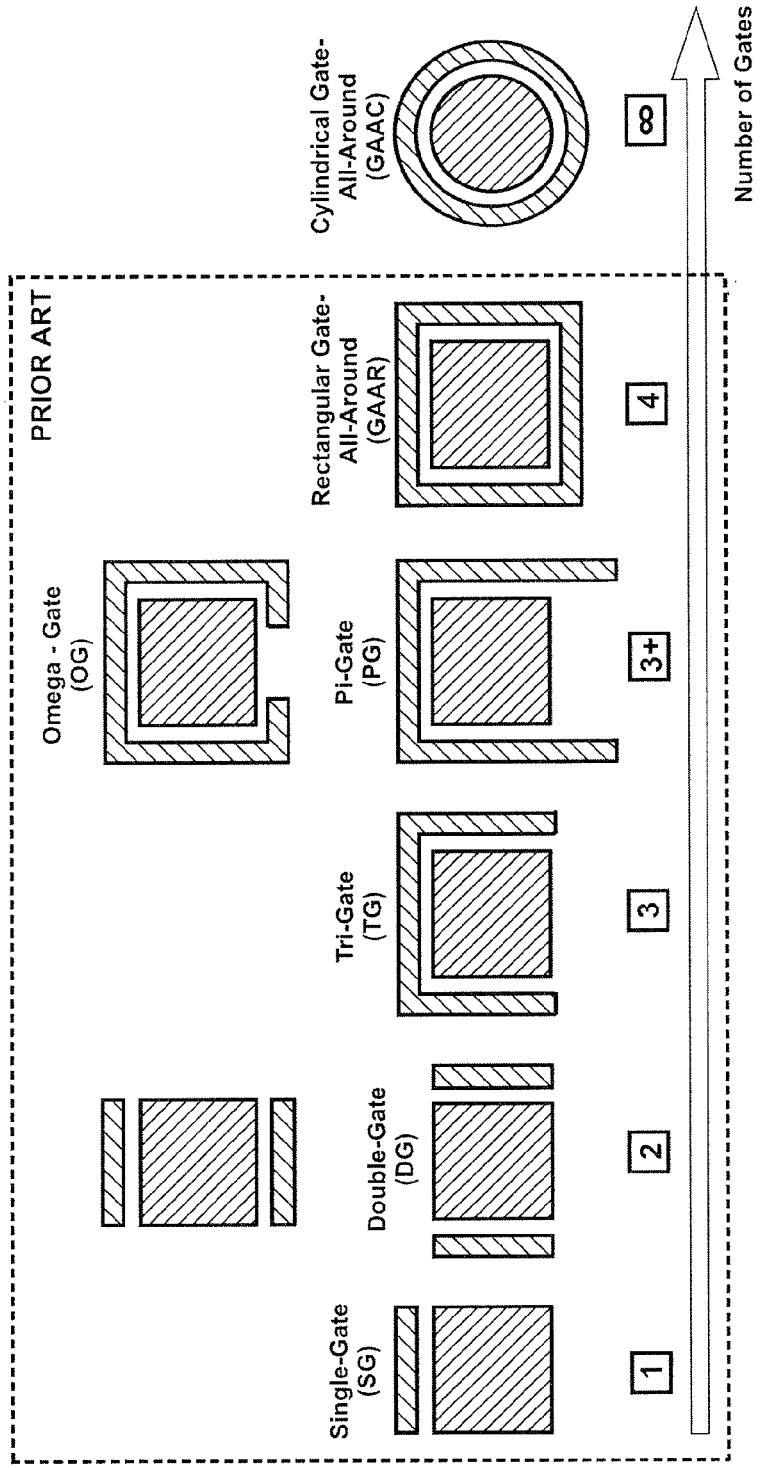
FIG. 1 is a simplified diagram showing schematic gate cross-sections of a series conventional multi-gate devices and a gate all-around cylindrical (GAAC) device according to an embodiment of the present invention.

FIG. 1 is a simplified diagram showing a series of gate structure cross-sections for various evolved multi-gate devices in terms of their equivalent number of gates. The diagrams included in the dashed box belong to the conventional devices starting with the SG device. First, beyond the DG device, it comes with Tri-gate (TG) device with a gate region covering three sides of the channel region to improve the field confinement. Further, Pi-gate (PG) or Omega-gate (OG) device (with 3+gates) extends the gate region of the tri-gate device trying to reduce the opening gap of the gate region thus reducing the off-current leakage.

More recently, gate-all-around (GAA) device has been developed in which the gate region surrounds the channel region completely without leaving a gap as other previous multi-gate device. However, due to the process limitation, the channel regions of these GAA type devices are in rectangular shape. In other words, the GAA device basically is an equivalent 4-gate type device or named as a gate-all-around rectangular (GAAR) device. For making a GAAR type device, there are some process difficulties existing for forming a channel bridge due to the relative large width of the channel structure. For example the well-established planar CMOS process technology cannot be applied to form the required GAAR structure in some proposed designs. Additionally, electrical field in the rectangular channel is still not uniform due to the unavoidable corner effect. Therefore, as shown in the last schematic diagram outside the dashed box in FIG. 1, according to an embodiment of the present invention, a device with essentially infinite number of gates surrounding a cylindrical channel is provided to reduce the problems of the conventional multi-gate devices. It is to be understood that the device as shown in FIG. 1 is merely an example, which may be altered and/or modified, which should not limit the scope of claims.

Figure 2:
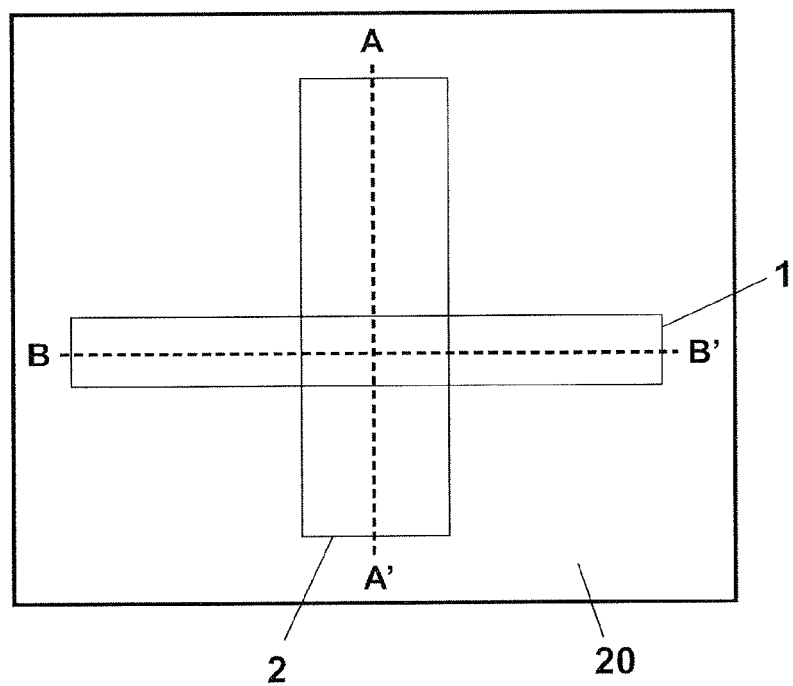
FIG. 2 is a simplified top-view of a surface region of an insulation layer on a substrate, the surface region comprising a first region positioned along an axis of B-B' and a second region crossing the first region along a substantially perpendicular axis of A-A' are defined, according to an embodiment of the present invention.

FIG. 2 shows a top view of a surface of an oxide layer overlaying a substrate according to an embodiment of the present invention. This diagram is merely an example, which should not unduly limit the scope of the claims herein. One of ordinary skill in the art would recognize many variations, alternatives, and modifications. For the convenience of description, the surface region 20 is divided by a first region 1 along and around an axis B-B', a second region 2 along and around an axis A-A', and the rest surface of oxide 20. According to an embodiment of the present invention, the axis A-A' is substantially perpendicular to the axis B-B'. The region 1 crosses and overlaps with the region 2. The semiconductor device according to an embodiment the present invention is structured in both the region 1 and the region 2 and interposed in vertical dimension as shown below.

Figure 3A:
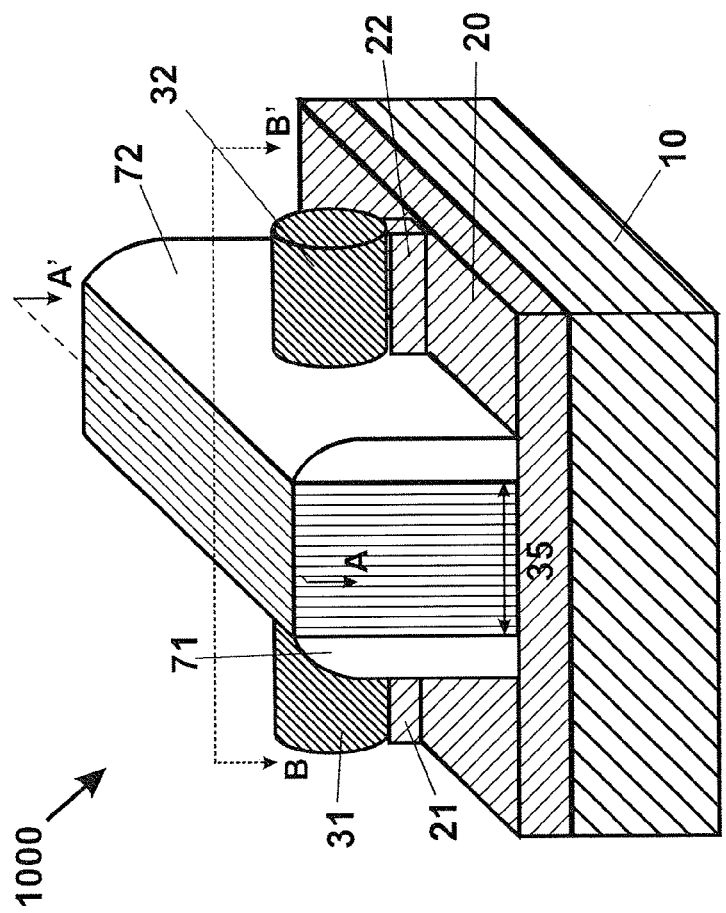
FIG. 3A is a simplified perspective view of a device structure in accordance with an embodiment of the invention.
Figure 3B:
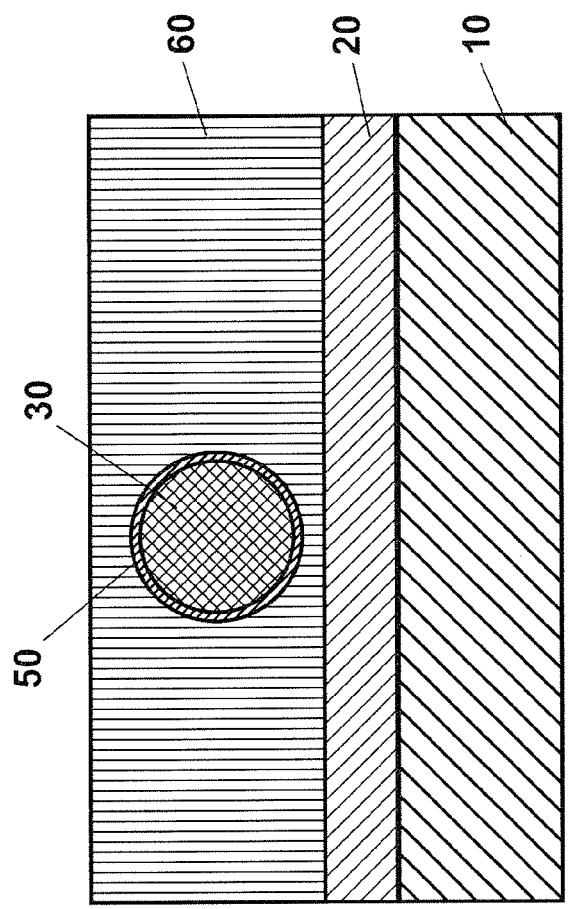
FIG. 3B is a simplified cross-sectional view cutting along the A-A' plane of FIG. 3A.
Figure 3C:
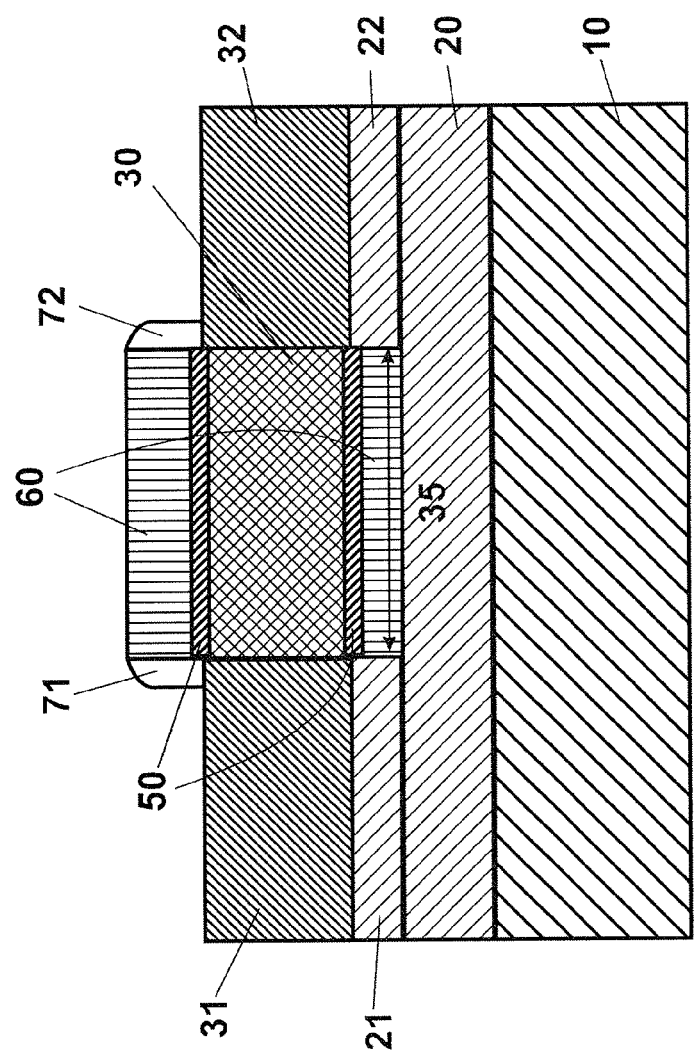
FIG. 3C is a simplified cross-sectional view cutting along the B-B' plane of FIG. 3A.

FIGS. 3A, 3B, and 3C show a simplified diagram for a gate-all-around cylindrical (GAAC) nanowire finFET device 1000 according to an embodiment of the present invention. These diagrams are merely examples, which should not unduly limit the scope of the claims. One of the ordinary skill in the art should recognize many variations, alternatives, and modifications. FIG. 3A provides a perspective view of the device 1000. FIG. 3B illustrates a cross-section view cutting along an A-A' plane of the FIG. 3A. The A-A' plane as shown is a vertical plane along the axis A-A' in FIG. 2. FIG. 3C illustrates a cross-section view cutting along a B-B' plane of the FIG. 3A. The B-B' plane is a vertical plane along the axis B-B' in FIG. 2. The device 1000 includes the following components: a substrate region 10, an insulation layer 20, undercut structure 21 and 22, a channel region 30, a source region 31, a drain region 32, a gate region 60, a gate dielectric layer 50, insulation spacer regions 71 and 72.

Although the above has been shown using a specific group of components for the device 1000, there can be many alternatives, modifications, and variations. For example, some of the components may be expanded and/or combined. Other components may be inserted to those noted above. Depending upon the embodiment, the arrangement of components may be interchanged with others replaced. For example, the device 1000 is an N-type GAAC finFET. In another example, the device 1000 is a P-type GAAC finFET. Further details of these components are found throughout the present specification and more particularly below.

Referring to FIG. 3A, the components mentioned above are formed on the insulation layer 20 overlaying a bottom substrate 10 according to one embodiment of the invention. For example, the insulation layer 20 is the buried oxide layer of an SOI wafer substrate. In another example, a layer of semiconductor, i.e., the SOI layer, overlays the insulation layer 20 or the buried oxide layer. The threshold-adjustment ion implantation is performed in the SOI layer with either n-type dopants or p-type dopants. In one example, the n-type dopant is Boron ion. In another example, the p-type dopant is Arsenic ion. In yet another example, the dopant concentration is in a range from $10^{18}$ to $10^{19}$ cm$^{-3}$.

Referring to FIGS. 2, 3A, 3B, and 3C, according to an embodiment of the present invention, the device 1000 includes a wire pattern formed by patterning of the SOI layer on the surface of insulation layer 20 in the region 1 along the axis B-B'. As shown in FIG. 3C, the wire pattern includes a source and/or drain regions 31 and 32 in the two opposite end-sections and a channel region 30 in the middle section. As an example, the wire pattern is symmetrical, and thus drain and source regions may be flipped. In one example, the wire pattern through its whole length including two end-sections and middle section is associated with a width in a range of 4 nm to 50 nm. As an example, the wire is referred to as "nanowire" through various parts of the application, and should not unduly limit the scope of claims.

Referring to FIGS. 3A and 3C, according to one embodiment of the present invention, the source region 31 and the drain region 32 are formed through heavily doping the two end-sections with a dopant polarity that is opposite to the channel region 30. For example, the channel region has its doping substantially the same as the SOI layer. In a specific instance, the source/drain regions 31 and 32 are doped heavily with N' implant as the channel region 30 is doped as p-type. In another example, the source/drain regions 31 and 32 are doped heavily with P$^+$ implant as the channel region 30 is doped as n-type.

As shown in to FIGS. 3A, 3B, and 3C according to an embodiment of the present invention, the source region 31 and the drain region 32 are in contact with the insulation layer 20 through undercut structure 21 and 22, respectively. The undercut structure 21 or 22 consists a same dielectric material as the insulation layer 20. The channel region 30 is characterized by a cylindrical shape with a specific length 35 as shown. According to various embodiment, the channel region 30 is not in directly in contact with the underneath insulation layer 20. For example, the channel length 35 of the cylindrical channel region 30 with is wrapped by a gate insulation layer 50. In one embodiment as shown in FIGS. 3B and 3C the cylindrical shape of the channel region 30 with the channel length 35 that is wrapped by the gate dielectric layer 50 is preserved. In another embodiment, the gate dielectric layer 50 essentially made of a thin layer of material with a high dielectric constant (e.g., defined by high-k) and a large bandgap. For example, the gate dielectric layer 50 is hafnium oxide H$_f$O with a k value as high as 34?. In another example, the gate dielectric layer 50 grown by atomic layer deposition (ALD) has a thickness ranging from 1 nm to 3 nm.

According to certain embodiments of the present invention, as shown FIGS. 2, 3A, 3B, and 3C, the device 1000 further includes a gate region 60 that is patterned to form on the insulation layer 20 in the region 2 along an axis A-A'. In one embodiment, the gate region is positioned along the axis A-A' direction to cross the wire pattern in the channel region 30 and confined along the B-B' direction by the channel length 35. The relative direction of the axis A-A' is substantially perpendicular to the axis B-B'. In another embodiment, referring to FIGS. 3B and 3C, the gate region 60 entirely surrounds the cylindrical shaped channel region 30 with the gate dielectric layer 50 interposed. In one example, the gate region 60 is in-situ N' heavily doped poly-silicon layer with a thickness ranging from 100 nm to 500 nm. In another example, the conductive material of the gate region 60 is made from a metal layer with a thickness ranging from 10 nm to 200 nm deposited by a chemical vapor deposition (CVD) method. It is to be understood that embodiments of the present invention may be implemented in various ways. According to an embodiment of the present invention, the device 1000 includes a gate-all-around cylindrical nanowire architecture with a gate length that is about the same of the channel length 35.

As shown in FIGS. 3A and 3C, the gate region 60 is separated with the wire pattern in the channel region 30 by the gate dielectric layer 50. The gate region 60 is also not direct in contact with the two end-sections of the wire pattern. Particularly in one embodiment, the device 1000 includes a spacer region 71 and a spacer region 72 located between the gate region 60 and either the source region 31 or the drain region 32 along the wire pattern. The spacer region 71 is in contact with the insulation layer 20 including an undercut structure 21, and the spacer region 72 is in contact with the insulation layer 20 including an undercut structure 22. In another embodiment, the spacer regions 71 and 72 are in contact the gate dielectric layer 50 at the two ends of the cylindrical channel 30. In one example, the spacer region 71 or 72 is made of insulation material including atomic-layer-deposited an oxide-nitride-oxide (ONO) layer. It is to be understood that the insulation spacer regions may include other types of materials.

Figure 4A:
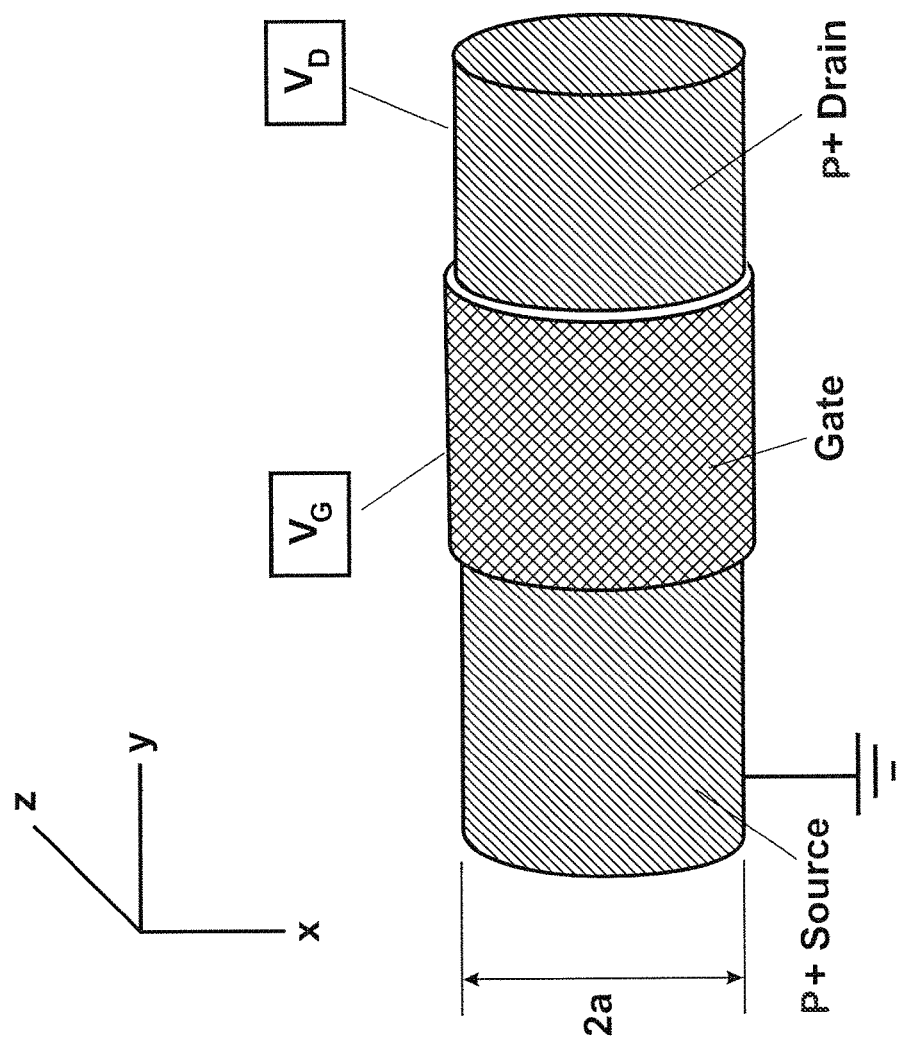
FIG. 4A is a simplified diagram showing a cylindrical semiconductor wire divided by a source region, a drain region, and a gate surrounding the channel region (not shown) in the middle section according to an embodiment of the present invention.
Figure 4B:
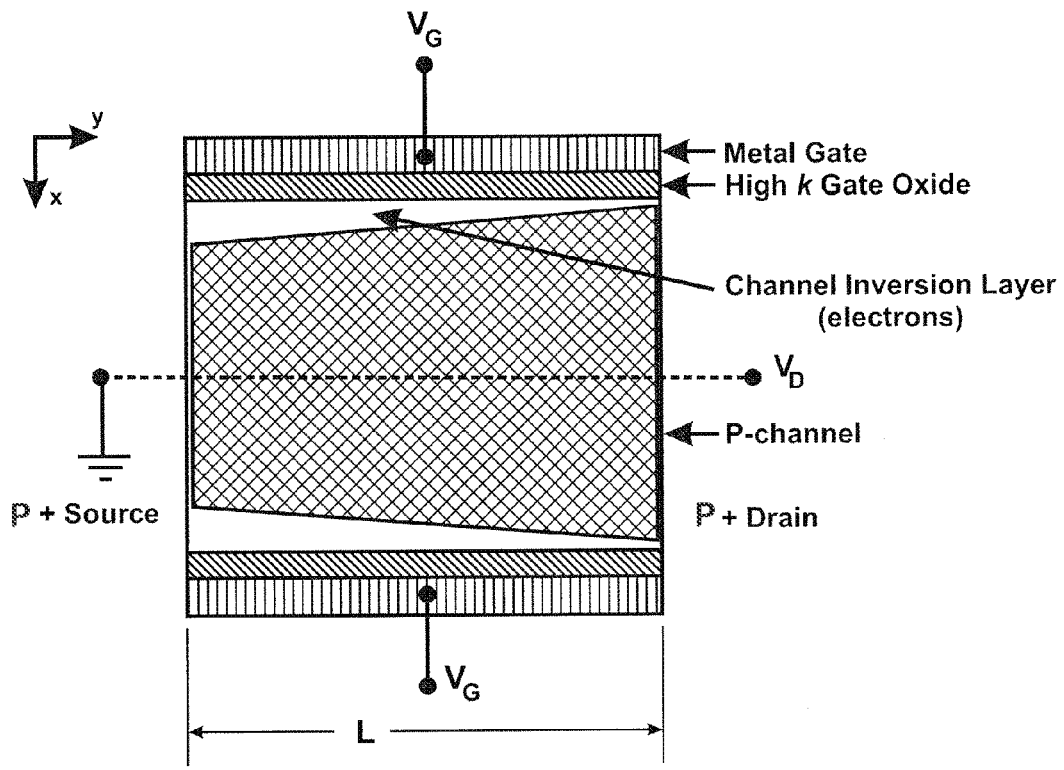
FIG. 4B is a simplified diagram showing a cross-section view of the gate region in FIG. 4A according to an embodiment of the present invention.
Figure 4C:
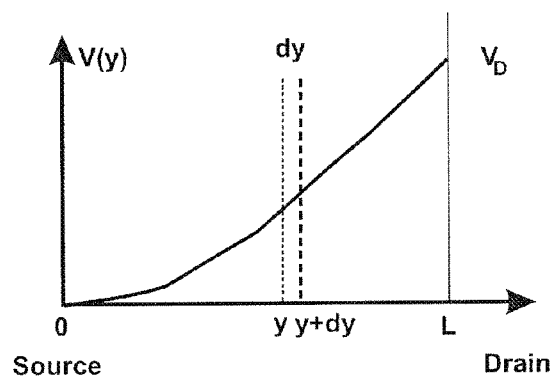
FIG. 4C is a simplified diagram showing a plot of electric field across the channel region with a length L in FIG. 4B according to another embodiment of the present invention.

FIG. 4A is simplified diagram showing an device with a cylindrical semiconductor wire divided by a source region, a drain region, and a gate surrounding the channel region (not shown) in the middle section, according to an embodiment of the present invention. FIG. 4B is simplified diagram of a x-y cross-section view of a gate/channel region showing an insulation layer separating the gate from the channel region and the formation of channel inversion layer (electron as the carrier). FIG. 4C is a simplified diagram showing electric field distribution in the channel along the y-direction. These diagrams are merely examples for illustrating certain device applications of the present invention, which should not unduly limit the scope of the claims. One of ordinary skill in the art would recognize many variations, alternatives, and modifications.

As an example, the device as illustrated according to FIGS. 4A, 4B, and 4C has various characteristics, which may include that the channel region of the semiconductor wire has an ideal cylinder shape with a length of L and a diameter of $2a$; that the gate is a metal gate with a bias voltage $V_G$ applied; that the gate insulation layer is a high-k oxide; that the channel region is a p-type silicon; that the source region is $P^+$ implanted and is grounded; and that the drain region is $P^+$ implanted with bias voltage $V_D$ applied. The bias voltages $V_G$ that applied to the gate electrode helps create a channel inversion layer that is triggered at a certain threshold. A current flow is produced from the source region across the channel region to the drain region. The electric field inside the channel can be modulated by the applied gate bias $V_G$ to control the drain current.

With reference to FIGS. 4A-4C, the electrical properties of the semiconductor region, which in some cases can include band engineered semiconductor, can be described by Poisson's Equation, which relates the electrostatic potential and space charge distribution, $$\frac{d^2\psi}{dx^2} = -\frac{dF}{dx} = -\frac{\rho_S}{\varepsilon_S} = -\frac{e}{\varepsilon_S}(p - N_A)$$

Within the P-type semiconductor depletion region w (completely depleted negative space charge region), this equation simplifies to the following, $$\frac{d^2\psi}{dx^2} = -\frac{dF}{dx} = \frac{eN_A}{\varepsilon_S}$$

for $$0 \le x \le w$$

The electric field distribution in depletion region can be obtained by solving the Poisson's equation.

$$V(y) + V_G = V_{ox} + \psi_S = \frac{eN_A wd}{\varepsilon_{ox}} + \frac{eN_A w^2}{2\varepsilon_S}$$

$$V_{Dsat} = \frac{eN_A ad}{\varepsilon_{ox}} + \frac{eN_A a^2}{2\varepsilon_S} - V_G, \text{ (when } w = a\text{)}$$

$$V_G = \frac{eN_A w_1 d}{\varepsilon_{ox}} + \frac{eN_A w_1^2}{2\varepsilon_s}, \text{ (at } y = 0, V(0) = 0\text{)}$$

$$V_G + V_D = \frac{eN_A w_2 d}{\varepsilon_{ox}} + \frac{eN_A w_2^2}{2\varepsilon_s}, \text{ (at } y = L, V(L) = VD\text{)}$$

The electric field distribution in a fully encapsulated cylindrical fec-FDFET device according to an embodiment of the present invention is symmetric in the cross section of the channel region surrounded by the gate of the transistor. The cross-sectional area for current flow is given by, $$A = \pi(a-w)^2$$

$$A = \pi(a-w)^2$$

where a is the radius of the cylinder and w is the depletion width at point of y. Thus, the resistance of the channel can be expressed by, $$R = \rho \frac{L}{A}$$
$$= \frac{L}{e\mu_p N_A A}$$
$$= \frac{L}{\pi e \mu_p N_A (a-w)^2}$$

The current-voltage characteristic of the Fully Encapsulated Cylindrical fec-FDFET Device can be derived as follows.

$$dV = I_D dR = \frac{I_D dy}{\pi e \mu_p N_A (a-w)^2}$$

$$I_D dy = \pi e \mu_p N_A (a-w)^2 dV$$

$$dV = \left(\frac{eN_A d}{\varepsilon_{ox}} + \frac{eN_A}{\varepsilon_s} w\right) dw$$

$$I_D dy = \pi e \mu_p N_A (a-w)^2 \left(\frac{eN_A d}{\varepsilon_{ox}} + \frac{eN_A}{\varepsilon_s} w\right) dw$$

Integrating IDdy over the whole gate length (from y=0 to y=L), the transistor current can be expressed as:

$$I_D = \frac{1}{L} \int_{w_1}^{w_2} \pi e \mu_p N_A (a-w)^2 \left(\frac{eN_A d}{\varepsilon_{ox}} + \frac{eN_A}{\varepsilon_s} w\right) dw$$

$$= \frac{1}{L} \int_{w_1}^{w_2} \pi e \mu_p N_A \left[(a^2 - 2aw + w^2)\left(\frac{eN_A d}{\varepsilon_{ox}} + \frac{eN_A}{\varepsilon_s} w\right)\right] dw$$

$$= \frac{1}{L} \int_{w_1}^{w_2} \pi e \mu_p N_A \left[\frac{eN_A d a^2}{\varepsilon_{ox}} + \left(\frac{eN_A a^2}{\varepsilon_s} - \frac{2eN_A d a}{\varepsilon_{ox}}\right) w + \right.$$

$$\left.\left(\frac{eN_A d}{\varepsilon_{ox}} - \frac{2eN_A a}{\varepsilon_s}\right) w^2 + \frac{eN_A}{\varepsilon_s} w^3\right] dw$$

$$= \frac{1}{L} \pi e \mu_p N_A \left[\frac{eN_A d a^2}{\varepsilon_{ox}} w + \left(\frac{eN_A a^2}{2\varepsilon_s} - \frac{eN_A d a}{\varepsilon_{ox}}\right) w^2 + \right.$$

-continued $$\left(\frac{eN_A d}{3\varepsilon_{ox}} - \frac{2eN_A a}{3\varepsilon_s}\right) w^3 + \frac{eN_A}{4\varepsilon_s} w^4 \right]$$

In an embodiment, the Fully Encapsulated Cylindrical fec-FDFET Device I-V Characteristics can be expressed as, $$I_D = \frac{\pi \mu_p (eN_A)^2}{\varepsilon_s L} \left[ \frac{\varepsilon_s}{\varepsilon_{ox}} da^2 w_2 + \left(\frac{a^2}{2} - \frac{\varepsilon_s}{\varepsilon_{ox}} da\right) w_2^2 + \left(\frac{\varepsilon_s d}{3\varepsilon_{ox}} - \frac{2a}{3}\right) w_2^3 + \frac{1}{4} w_2^4 - \frac{\varepsilon_s}{\varepsilon_{ox}} da^2 w_1 - \left(\frac{a^2}{2} - \frac{\varepsilon_s}{\varepsilon_{ox}} da\right) w_1^2 - \left(\frac{d\varepsilon_s}{3\varepsilon_{ox}} - \frac{2a}{3}\right) w_1^3 - \frac{1}{4} w_1^4 \right]$$

where $$w_1 = \sqrt{\left(\frac{\varepsilon_s}{\varepsilon_{ox}} d\right)^2 + \frac{2\varepsilon_s V_G}{eN_A}} - \frac{\varepsilon_s}{\varepsilon_{ox}} d,$$

and, $$w_2 = \sqrt{\left(\frac{\varepsilon_s}{\varepsilon_{ox}} d\right)^2 + \frac{2\varepsilon_s (V_G + VD)}{eN_A}} - \frac{\varepsilon_s}{\varepsilon_{ox}} d$$

where
- w1 and w2 represent the deplete width of the semiconductor at the source and drain respectively;
- a: silicon Cylinder radius;
- L: gate length;
- Co: gate oxide capacitance per area;
- $N_A$: Density of acceptor impurity atoms;
- $n_i$: intrinsic concentration of electrons;
- $\mu_n$: electron mobility;
- k: Boltzmann's constant;
- e: electronic charge;
- $\varepsilon_s$: dielectric constant; and
- VD and VG are the voltages applied to the drain and the gate respectively.

Figure 5A:
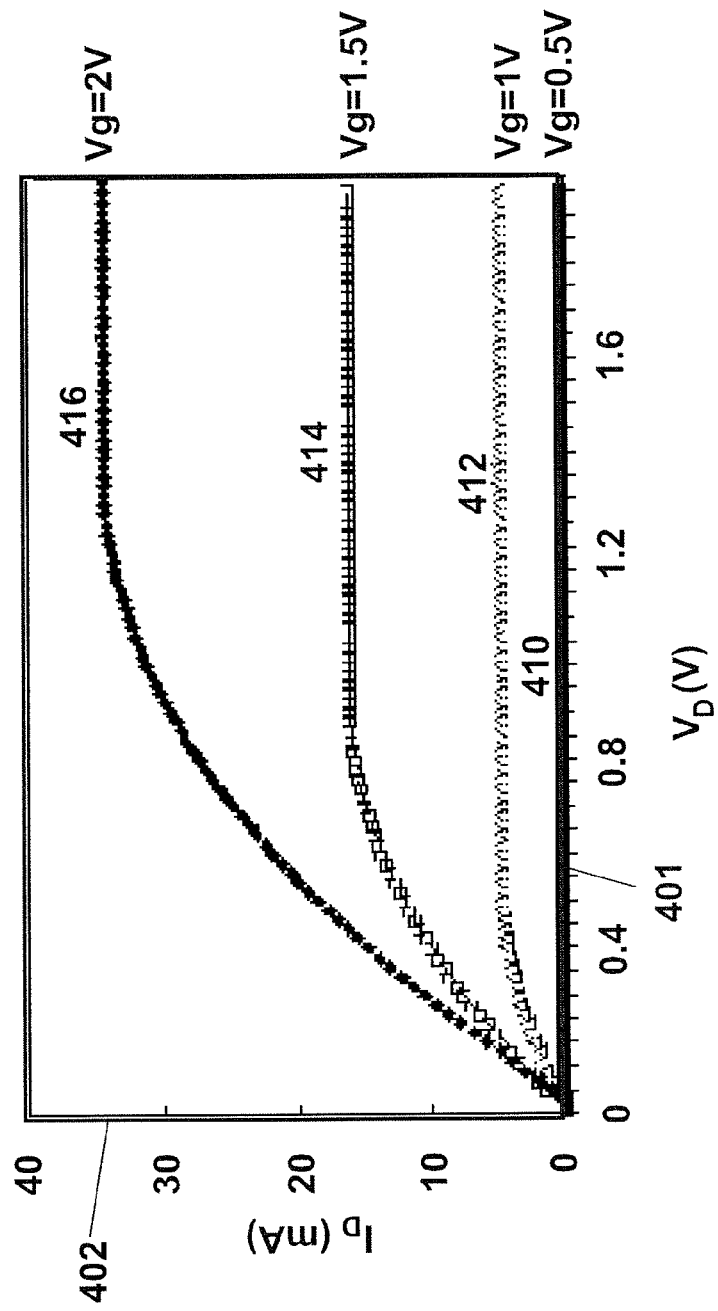
FIG. 5A is a simplified diagram showing drain current as a function of drain voltage for a gate-all-around cylindrical nanowire finFET device at the different gate bias voltages according to an embodiment of the present invention.

FIG. 5A is a simplified diagram showing drain current as a function of drain voltage for a gate-all-around cylindrical (GAAC) nanowire finFET at the different gate bias voltages according to an embodiment of the present invention. This diagram is merely an example, which should not unduly limit the scope of the claims. One of ordinary skill in the art would recognize many variations, alternatives, and modifications. For example, the GAAC nanowire finFET is the device 1000. As shown in FIG. 5A, a horizontal axis 401 represents the voltage applied to the gate region 60, and a vertical axis 402 represents the drain current flowing from source region 31 to the drain region 32, provided that the source region 31 is grounded. The channel region 30 has a cylindrical shape. For example, the channel region 30 has a cylinder radius of 10 nm and the channel length 35 is 10 nm, and the gate dielectric layer 50 is 1 nm in thickness. In a specific embodiment, the doped impurity density in channel is $5 \times 10^{18}$ cm$^{-3}$. The work function difference between the gate region 60 and the channel region 30 is −0.8V. For curves 410, 412, 414, and 416, the gate region is biased to 0.5V, 1V, 1.5V, and 2V, respectively. For example, the curves 410, 412, 414, and 416 each are obtained based on Eq. 1. As shown in FIG. 5A, the gate threshold voltage, at the device conditions provided above, is no larger than 0.5V.

FIG. 5B is a simplified diagram showing drain current as a function of gate voltage for a GAAC nanowire finFET with a drain voltage of 0.1 V according to an embodiment of the present invention. This diagram is merely an example, which should not unduly limit the scope of the claims. One of ordinary skill in the art would recognize many variations, alternatives, and modifications. For example, device 1000 is a GAAC nanowire finFET. A horizontal axis 403 represents the voltage applied to the gate region 60, and a vertical axis 404, in logarithmic scale, represents the drain current flowing from the source region 31 to the drain region 32. For example, the graph is based on a scenario where the source region 31 is grounded and the drain region 32 is applied a bias voltage of $V_D$=0.1V. The cylindrical shaped channel region 30 has a cylinder radius of 10 nm and the channel length 35 is 10 nm. The gate dielectric layer 50 is 1 nm in thickness. The impurity density in the channel is $5 \times 10^{18}$ cm$^{-3}$. The work function difference between the gate region 60 and the channel region 30 is −0.8V. For curve 420, the drain region 32 is biased at 0.1V. For example, the curve 420 is obtained based on Eq. 1.

Figure 5C:
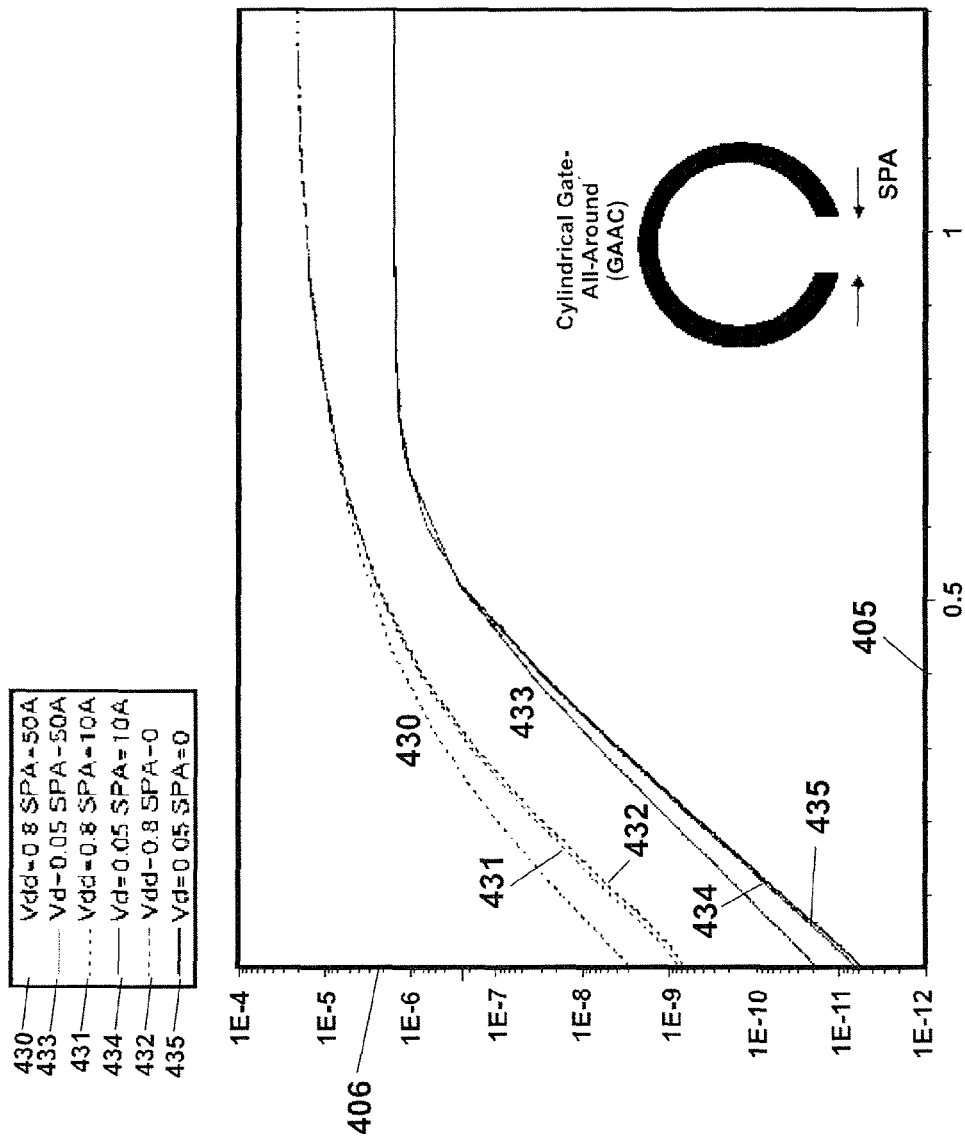
FIG. 5C is a simplified diagram showing drain current as a function of drain voltage for a gate-all-around cylindrical nanowire finFET device with different gate separation widths.

FIG. 5C is a simplified diagram showing drain current as a function of drain voltage for cylindrical type finFET devices with different gate separation widths. For zero gate separation width it becomes a GAAC nanowire finFET. For a non-zero gate separation width, it becomes a cylindrical Omega-gate type device. This diagram is merely an example, which should not unduly limit the scope of the claims. One of ordinary skill in the art would recognize many variations, alternatives, and modifications. For example, for the nanowire finFET with zero gate separation width is the device 1000.

As shown in FIG. 5C, a horizontal axis 405 represents the magnitude of the bias voltage applied to the gate region. A vertical axis 406 represents the current flowing from the source to drain. The gate separation width (SPA) is defined as the width of the insulation undercut structure under the channel region 30 of the wire pattern in the device 1000. It is understood that the term "SPA" is broadly defined and should not unduly limit the scope of claims. When SPA is zero, the ridge structure under the channel region 30 is removed so that the device is turned to be a GAAC nanowire finFET, (e.g., the device 1000). For curves 430, 431, and 432 the drain bias voltage of 0.8V is applied. For curves 433, 434, and 435 the drain voltage bias voltage of 0.05V is applied. For either cases with different drain bias, as the SPA is reduced from 50 Å to 10 Å and to 0, the drain current decreases at a fixed sub-threshold gate voltage. Among other things, the drain current decreases as a function of SPA decrease is an indication of a better performance in terms of off-current leakage for GAA type than others with a gate gap. This proves a clear advantage of the GAAC nanowire finFET device according to the present invention over the conventional multi-gate devices in terms of short-channel effect suppression.

Figure 5D:
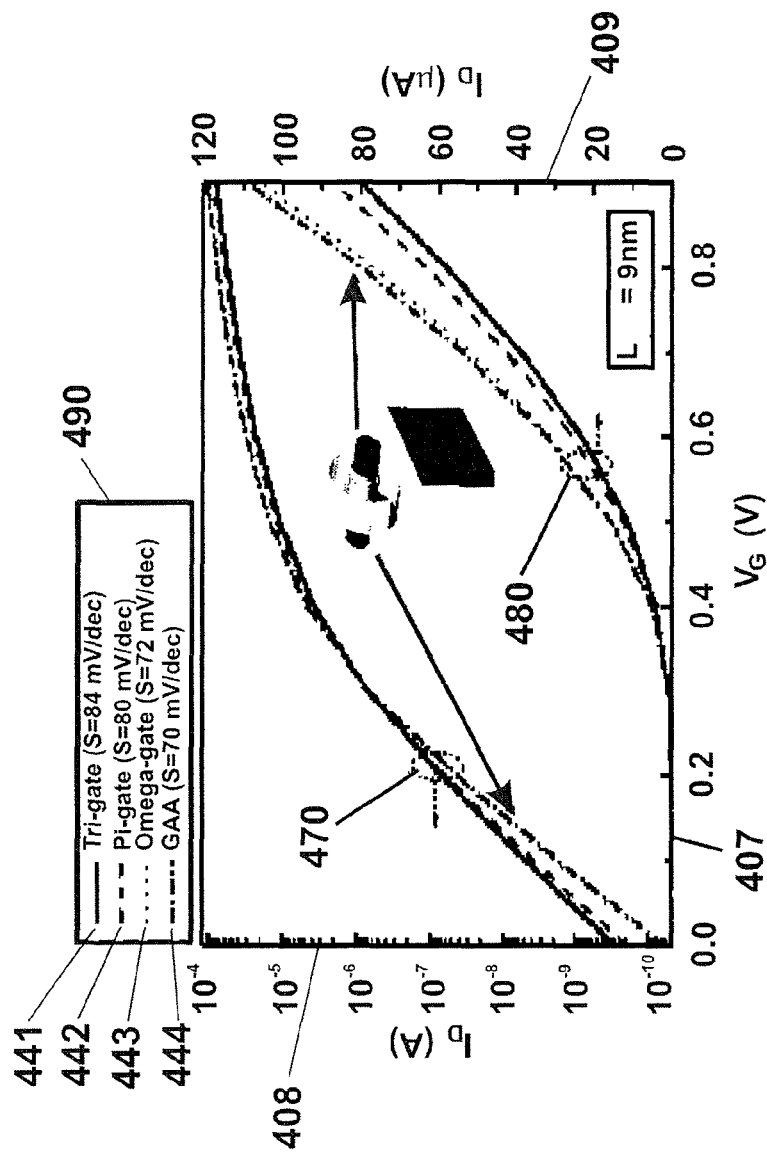
FIG. 5D is a simplified diagram comparing drain current as a function of gate voltage for a gate-all-around cylindrical nanowire finFET with that of Tri-gate, Pi-gate, and Omega-gate devices.

FIG. 5D is a simplified diagram illustrating drain current as a function of gate voltage for a GAAC nanowire finFET with that of rectangular Tri-gate, Pi-gate, or Omega-gate device, respectively. This diagram is merely an example, which should not unduly limit the scope of the claims. One of ordinary skill in the art would recognize many variations, alternatives, and modifications. For example, the GAAC nanowire finFET is the device 1000.

As shown in FIG. 5D, a horizontal axis 407 represents the bias voltage applied to the gate region 60. A first vertical axis 408 represents the drain current on logarithmic scale. A second vertical axis 409 represent the same current in linear scale. Curves 441, 442, 443, and 444 are shown in the legend 490 and represent the results for rectangular Tri-gate device, Pi-gate device, Omega-gate device, and GAAC nanowire device under a fixed condition, respectively. The fixed condition is the same for all devices above, including a 0.5V bias applied to the drain region, a channel width of 4 nm (diameter of 4 nm in GAAC nanowire), a gate length of 9 nm, and other intrinsic physical properties of the material. The gate separation is 0.8 nm for Pi-gate device and 0.4 nm for Omega-gate device. In comparison, a GAAC nanowire device according to embodiments of the present invention has no gate separation. For example, the GAAC nanowire device is the device 1000. A first region 470 represents a condition that the device is under sub-threshold gate voltage. In region 470, the GAAC nanowire device shows the lowest leakage current as compared to other devices, with the sub-threshold swing value S of 70 mV/dec, 72 mV/dec, 80 mV/dec, and 84 mV/dec for curves 444, 443, 442, and 441, respectively, indicated within the bracket in the legend 490. A second region 480 of the graph represents a condition that the device is working at the above threshold. In region 480, the GAAC nanowire device shows the highest drain current with a same gate voltage applied and the same gate dimension, demonstrating a better performance of the GAAC nanowire device according to an embodiment of the present invention over the conventional multi-gate devices.

In some embodiments, the present invention further combines the advantages of improved electrical integrity in the gate and the simplicity of the fabrications for the 3-dimensional gate structure compatible with planar CMOS technology. The advantage to the electrical integrity in the gate includes, among other things, making the number of gates virtually infinite for the GAAC nanowire finFET device, consequently eliminating the corner-effect induced off-current leakage existed in the GAAR finFET device. In the cylindrical shaped channel surrounded by a gate, the electrical field is uniform in any cross-section along the channel. Because no corner exists for the GAAC nanowire finFET, there is no abrupt increase or accumulation of carrier charge in the channel, thereby reducing the potential off-current leakage and enhancing the capability to scale down the device. In addition, advantage to the simplicity of the fabrications for the GAAC nanowire finFET over GAAR finFET device lies in one or more simplified processes to form a nanowire bridge structure. After horizontally forming a silicon cylindrical nanowire on the insulator surface, an undercut structure (smaller than the width of the nanowire) made of the insulator is created, effectively reducing the structure size that is required to be removed by lateral etching. In contrast, in conventional GAAR finFET, the fin structure is rectangular shape, which makes it more difficult to form a cavity underneath with the lateral etching. An alternative type of GAA nanowire finFET device has an architecture including a vertical channel with a gate surrounding in horizontal plane. But the fabrication process for this type of GAA finFET is not quite compatible with the conventional planar CMOS technology to be cost effective.

According to one embodiment, the present invention provides a semiconductor device having a gate-all-around cylindrical nanowire architecture includes a substrate, a first insulation layer overlaying the substrate, and a semiconductor wire overlying the first insulation layer along a first direction. The semiconductor wire includes a first end section, a middle section, and a second end section. The semiconductor device further includes a source region within the first end section and a drain region within the second end section. Additionally, the semiconductor device includes a channel region within the middle section a channel region being within the middle section. The channel region connects the source region and the drain region. The channel region is characterized by a substantially cylindrical shape having a radius and a length. The device further includes a second insulation layer surrounding the cylindrical channel region. Moreover, the device includes a gate electrode overlaying the second insulation layer all around the channel region and overlaying the first insulation layer along a second direction which is substantially perpendicular to the first direction. For example, the device is implemented according to the device 1000.

According to another embodiment, the present invention provides a transistor with a gate surrounding a cylindrical nanowire channel includes a substrate, a first insulation layer overlaying the substrate, and a semiconductor wire overlying the first insulation layer along a first direction. The semiconductor wire includes a first end section, a middle section, and a second end section. The transistor further includes a source region within the first end section and a drain region within the second end section. Additionally, the transistor includes a channel region within the middle-section connecting the source region and the drain region. The channel region is characterized by a substantially cylindrical shape having a radius and a length. The transistor further includes a second insulation layer wrapped around the channel region. Moreover, the transistor includes a gate electrode surrounding the second insulation layer all around the channel region and overlaying the first insulation layer along a second direction. The second direction being substantially perpendicular to the first direction. The gate electrode is associated with a gate length along the first direction substantially equal to the length of the channel. Furthermore, the transistor includes a first spacer region and a second spacer region. The first spacer region is in contact with the gate electrode, the second insulation layer, the source region, and the first insulation layer. The second spacer region is in contact with the gate electrode, the second insulation layer, the drain region, and the first insulation layer. For example, the transistor is implemented according to the device 1000.

Figure 6:
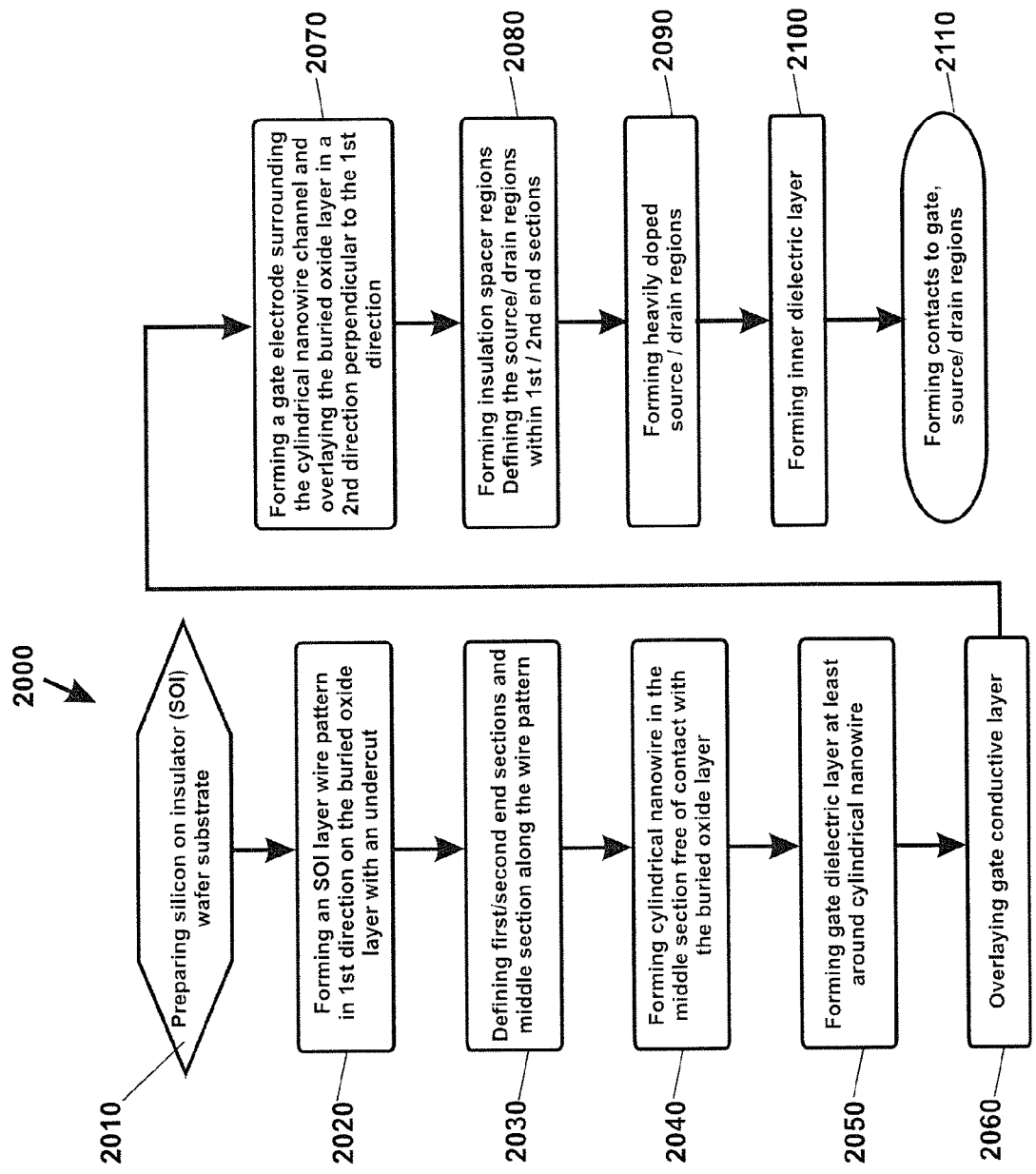
FIG. 6 is a simplified method for fabricating a semiconductor device having a gate-all-around cylindrical nanowire architecture according to an embodiment of the present invention.

FIG. 6 is a simplified flow diagram illustrating a method for fabricating a semiconductor device having a gate-all-around cylindrical nanowire architecture according to an embodiment of the present invention. This diagram is merely an example, particularly using an SOI wafer substrate, which should not unduly limit the scope of the claimed herein. For example, various steps may be added, removed, replaced, repeated, overlapped, and/or partially overlapped. The method 2000 includes the following processes:

1. Process 2010 for preparing an SOI substrate;
2. Process 2020 for forming a wire pattern on the buried oxide layer along a 1st direction;
3. Process 2030 for defining first end-section, middle section, and second end section along the wire pattern;
4. Process 2040 for forming cylindrical nanowire in the middle-section with a cavity underneath;
5. Process 2050 for forming gate dielectric layer at least around cylindrical nanowire;
6. Process 2060 for forming gate conductive layer;
7. Process 2070 for forming a gate region surrounding the cylindrical nanowire channel and overlaying the buried oxide layer in a 2nd direction perpendicular to the 1st direction;
8. Process 2080 for forming insulation spacer regions and defining the source and drain regions within first and second end-sections, respectively;
9. Process 2090 for forming heavily doped source and drain regions;
10. Process 2100 for forming inner dielectric layer; and
11. Process 2110 for forming contacts to gate, source, and drain regions.

The above sequence of processes provides a method according to an embodiment of the present invention. Other alternatives can also be provided where processes are added, one or more processes are removed, or one or more processes are provided in a different sequence without departing from the scope of the claims herein. For example, the transistor with a gate-all-around cylindrical nanowire architecture made by the method 2000 is the device 1000. Future details of the present invention can be found throughout the present specification and more particularly below.

Figure 7A:
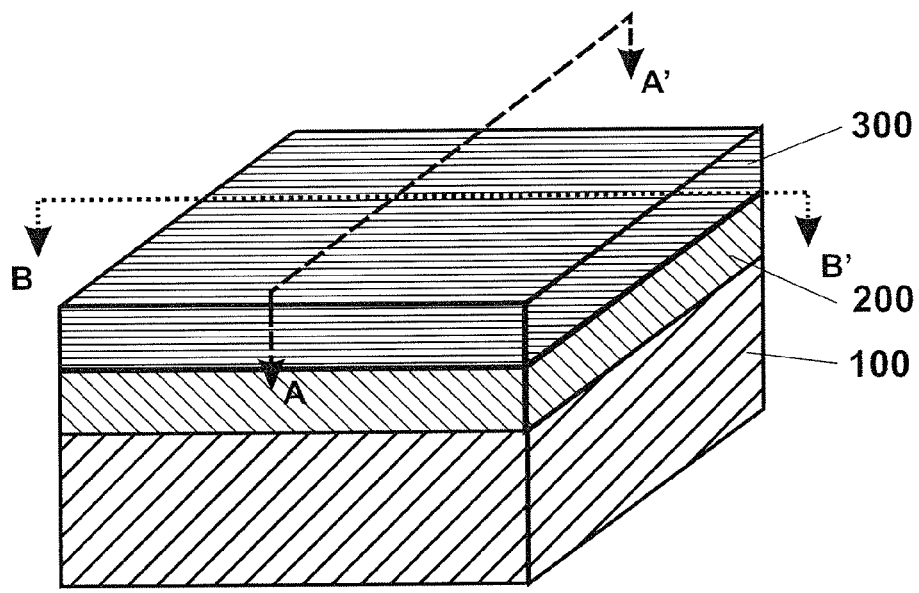
FIGS. 7A, 8A, 9A, 10A, 11A, 12A, 13A, and 14A are simplified diagrams showing perspective views illustrating process steps in accordance with the embodiment of the invention shown in FIG. 6.
Figure 7B:
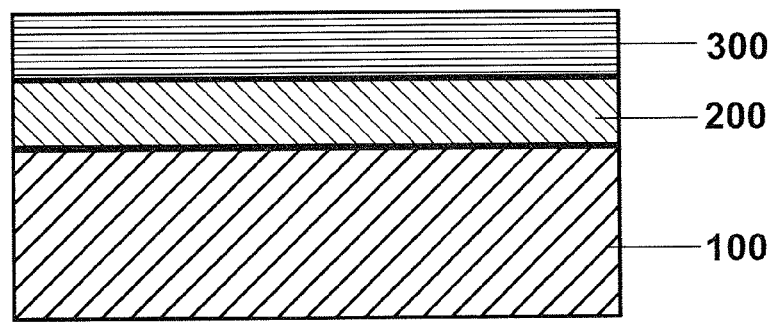

At the process 2010, an SOI wafer substrate including a bottom substrate, a buried oxide layer, and an SOI (i.e., silicon-on-insulator) layer, is provided. FIGS. 7A and 7B show a simplified method for preparing an SOI substrate for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications.

FIGS. 7A and 7B illustrate a perspective view and a side view (cutting along A-A' plane) of a portion of an SOI wafer, respectively. The SOI wafer includes a bottom wafer substrate 100. For example, the wafer substrate 100 is a silicon wafer. On the substrate 100, a buried oxide layer 200 is overlaid. For example, the buried oxide layer 200 includes silicon oxide and is formed with a thickness about 100 nm to 300 nm by a thermal oxidation process. Additionally, an SOI layer 300 overlays the buried oxide layer 200. For example, the SOI layer 300 is essentially made of silicon material. In another example, the SOI layer 300 is SiGe alloy or multi-layer. In yet another example, the SOI layer 300 is thicker than 10 nm and thinner than 150 nm. In an embodiment, the SOI layer 300 is processed according to a threshold-adjustment ion implantation performed with n-type dopants, under a condition: Specie: $B^+$, Dose: $(1-5)\times10^{12}$ ions.cm$^{-2}$, Energy: (1-30)keV. In another example, a threshold-adjustment ion implantation for the SOI layer is performed with p-type dopants in the SOI layer 300, under a condition: Specie: $As^+$, Dose: $(1-5)\times10^{12}$ ions.cm$^{-2}$, Energy: (1-20)keV. In yet another example, the final dopant concentration in the SOI layer 300 is around $(1-10)\times10^{18}$ cm$^{-3}$.

Figure 8A:
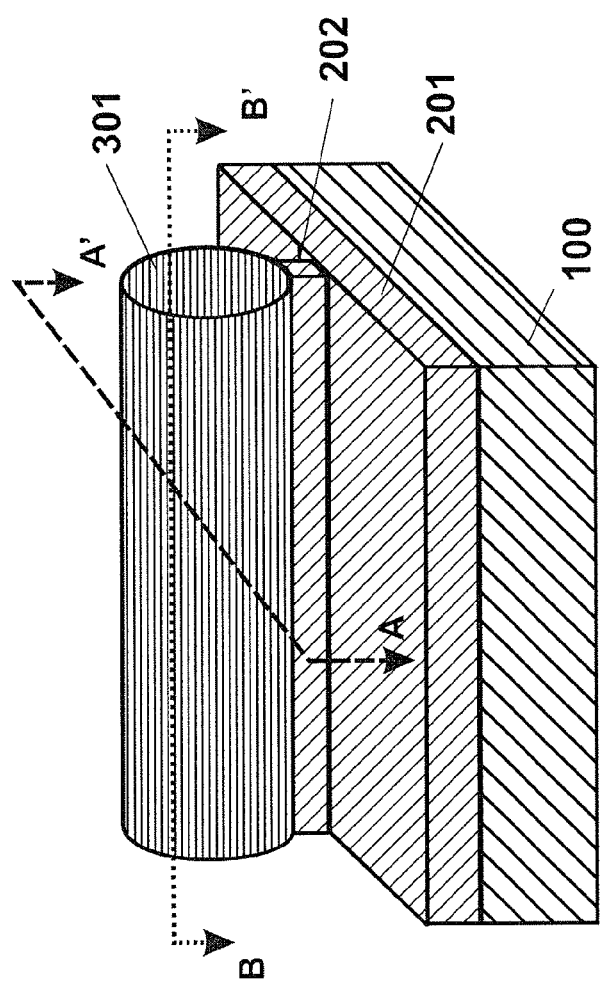
Figure 8C:
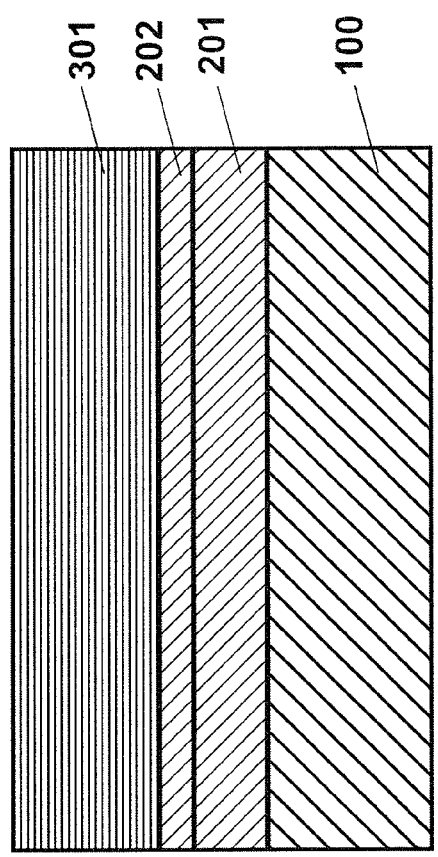
FIGS. 8C, 9C, 10C, 11C, 12C, 13C, and 14C are simplified cross-sectional views taken along the B-B' plane of FIGS. 8A, 9A, 10A, 11A, 12A, 13A, and 14A respectively.

At process 2020, the SOI layer and the buried oxide layer are patterned to form a wire pattern overlaying an undercut structure of the buried oxide layer in a certain direction. FIGS. 8A, 8B, and 8C show a simplified method for forming a wire pattern of the SOI layer on the buried oxide layer for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications.

As shown in FIGS. 8A, 8B and 8C, a wire pattern 301 is formed along an axis B-B' overlaying an undercut structure 202 on the etched buried oxide layer 201. The wire pattern 301 includes silicon material from the SOI layer 300. The undercut structure 202 includes oxide material from the buried oxide layer 200. In one embodiment, the SOI layer 300 is patterned using photolithography mask to define a region along and around the axis B-B'. In another embodiment, the silicon active area etching is performed to partially etch away the SOI layer 300 and down into the buried oxide layer 200. In one example, the etching process involves a silicon plasma dry etch. The silicon active area etching yields the wire pattern 301 within the defined region along the axis B-B', and a newly revealed surface of the etched oxide layer 201 outside of the defined region. In one embodiment, referring to FIG. 8B, the anisotropic wet etching is further performed at the oxide layer under the wire pattern 301 to produce the undercut structure 202. Nevertheless, the wire pattern 301 overlays the undercut structure 202 on the etched oxide layer 201. Namely, the width of the undercut structure 202 is less than the width of the wire pattern 301. In one example, the wire pattern 301 can be scaled down in size by utilizing thermal oxidation plus dilute HF solution dipping processes. FIG. 8B schematically shows the cross-section view cutting along the axis A-A' of the wire pattern 301 overlaying the undercut structure 202 with a reduced width. FIG. 8C shows the cross-section view cutting along the axis B-B' of the wire pattern 301 overlaying the undercut structure 202. The undercut structure 202 is a billet located above the dashed line and under the wire pattern 301.

Figure 9A:
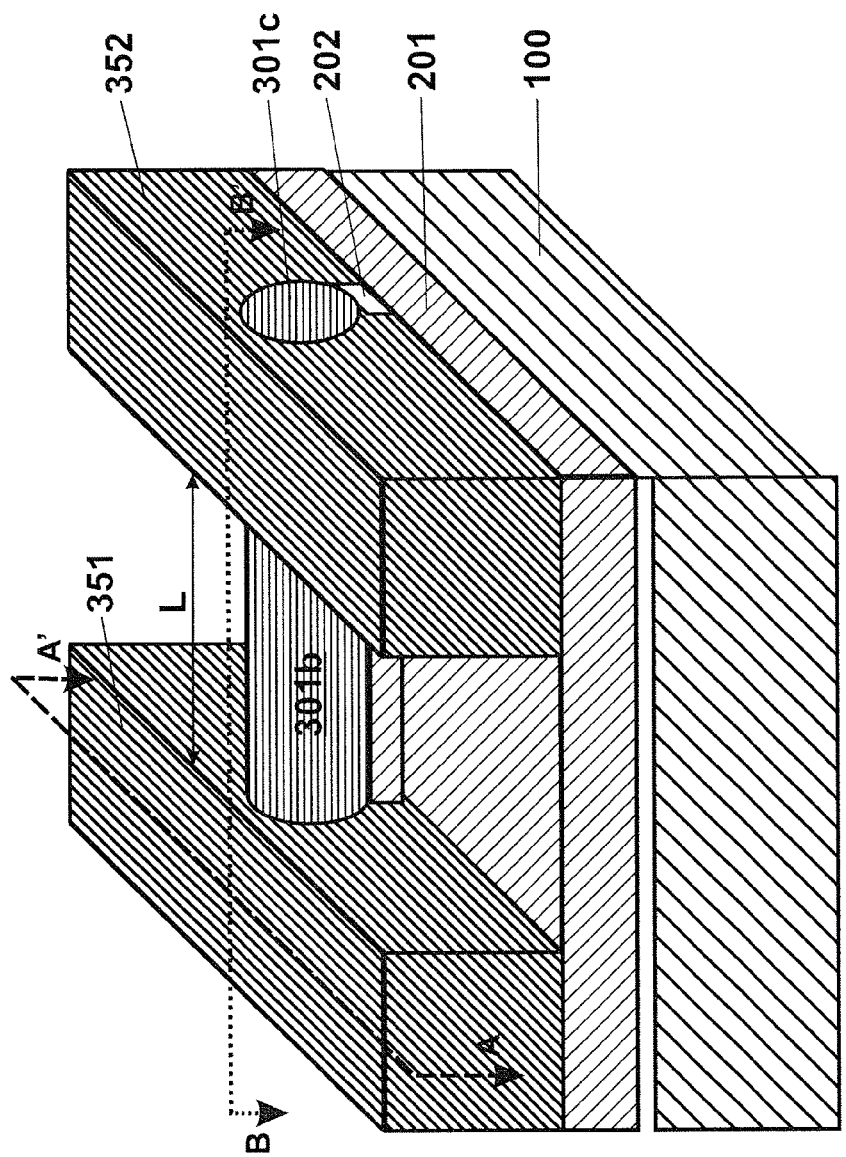
Figure 9C:
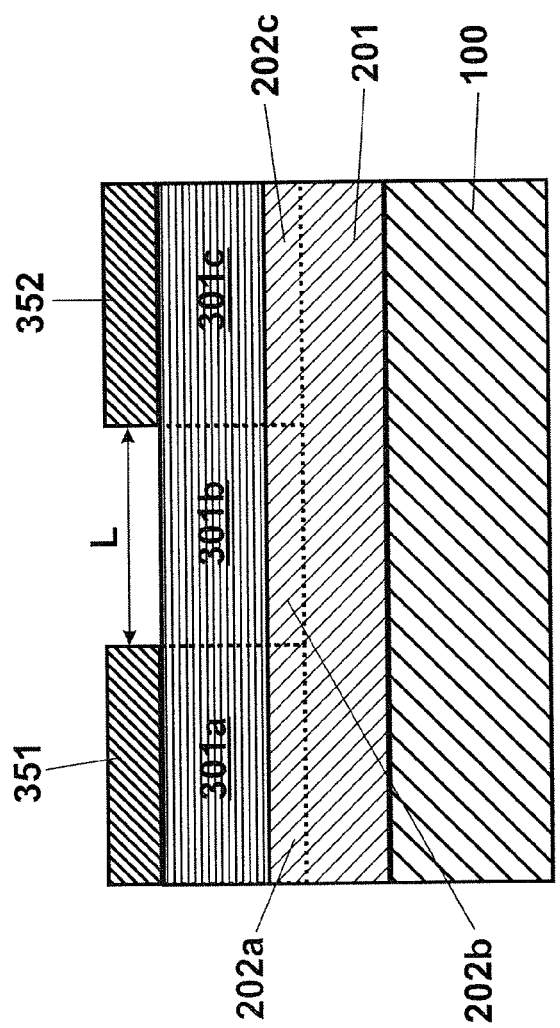

At process 2030, a first end section, a middle section, and a second end section along the wire pattern formed at process 2020 are defined. FIGS. 9A, 9B, and 9C show a simplified method for defining first/second end sections and middle section of the wire pattern of the SOI layer on the buried oxide layer for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications.

In one embodiment at the process 2030, photoresist layer is applied to cover the surface of the etched oxide layer 201 and the whole wire pattern 301 formed at process 2020 including the undercut structure 202. Lithography processing is performed with a pre-registered mask which exposes a middle section of the wire pattern 301 but covers two end sections. After the exposure, resist developing, and removal of the developed resist residue, the middle section of the wire pattern 301 with a lateral dimension L along B-B' direction including a portion of undercut structure 202 beneath and portions of etched oxide layer 201 on both sides thereof are revealed. As shown in FIG. 9A, the unexposed resist patterns 351 and 352 remains to cover the two end sections of the wire pattern 301 including portions of the undercut structure 202 and the surface of etched oxide layer 201 on both sides thereof. Thus, three regions are defined along the wire pattern 301 at process 2030. A first end section 301a is a portion of the wire pattern 301 covered by the resist pattern 351. Similarly, referring to FIG. 9A, a second end section 301c is a portion of the wire pattern 301 covered by the resist pattern 352. The middle section 301b, having a length of L, is the portion of the wire pattern 301 revealed through lithography at process 2030. FIG. 9C shows a cross-section view along B-B' plane outlined in FIG. 9A, illustrating the defined sections 301a, 301b, and 301c sequentially along the wire pattern 301.

In another embodiment, the undercut structure 202 underneath the first end section 301a, the middle section 301b, and the second end section 301c is correspondingly divided by the process 2030 to three undercut portions 202a, 202b, and 202c, respectively. FIG. 9B illustrates a cross-section view (along A-A' plane defined in FIG. 9A) of the first end section 301a partially surrounded by the resist pattern 351 and undercut 202a beneath. Specifically, the undercut portion 202b possesses a same length of L as the middle section 301b of the wire pattern. Nevertheless at the end of process 2030, the undercut portions 202a and 202c are still covered by the resist layer 351 and 352 respectively, while undercut portion 202b is revealed. Referring to FIG. 9A, the region not covered by the resist layer 351 or 352 in fact records a pattern registry that will be used for defining a gate region in one of later processes.

Figure 10A:
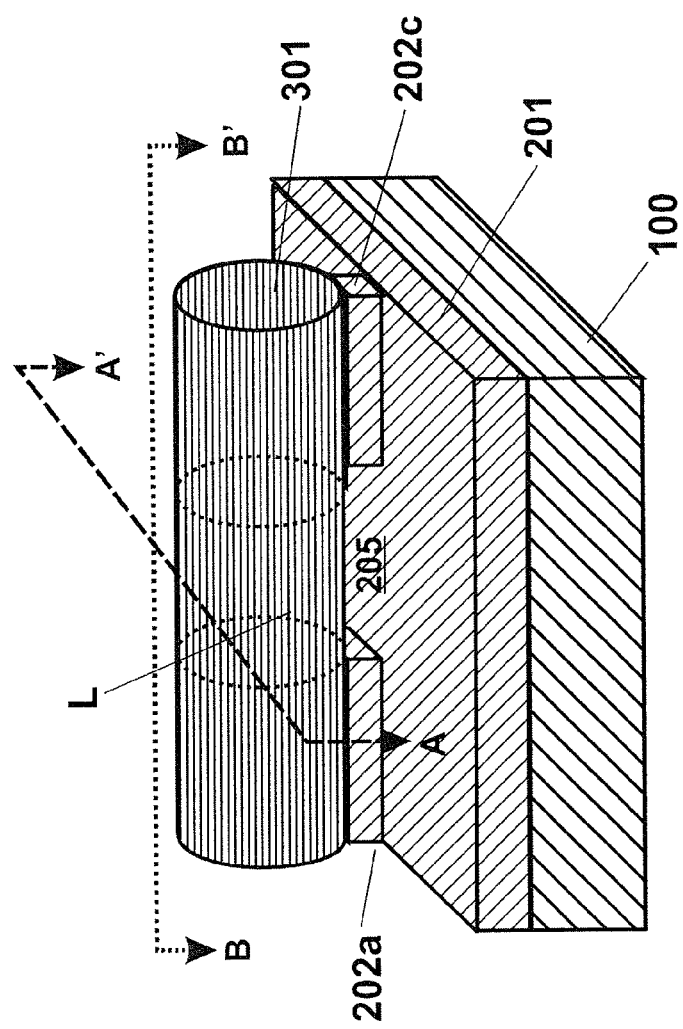
Figure 10B:
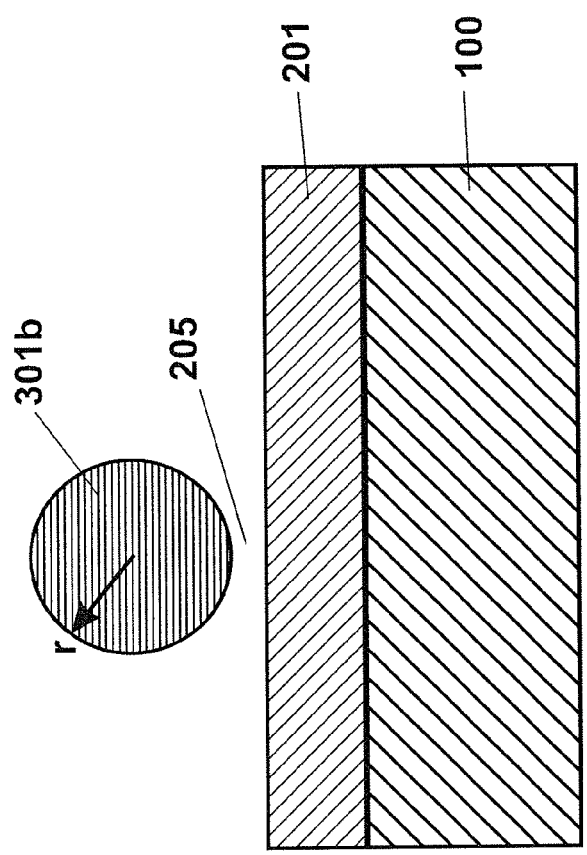
Figure 10C:
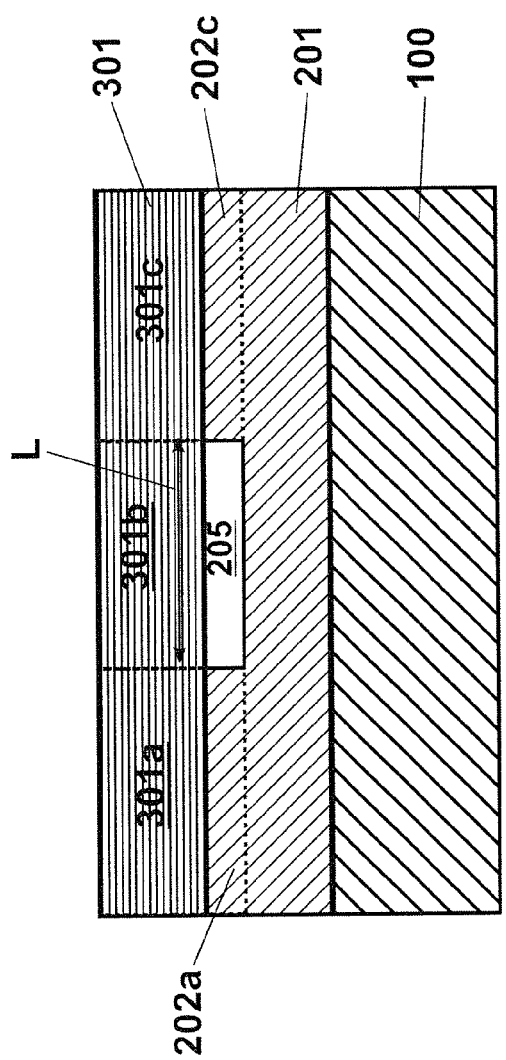

At process 2040, a cylindrical shaped nanowire with a cavity underneath is formed. FIGS. 10A, 10B, and 10C show a simplified method for forming cylindrical nanowire with no contact to the buried oxide layer for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications. For example, FIGS. 10A, 10B, and 10C each illustrates a view of a partially processed integrated circuits.

At the end of process 2030, the middle section 301b of the wire pattern and its undercut structure 202b are revealed while rest portions of the wire pattern and undercut structures are covered by the resist pattern 351 and 352. Under this condition, in one embodiment at process 2040 a lateral oxide etching process is performed using buffered oxide etchant (BOE) to remove selectively the revealed undercut portion 202b with rest of the surface covered by etch-stop layer mask. Due to the narrowed width of the undercut structure created in an earlier process 2020, this oxide etching process becomes greatly simplified. This process results in the formation of a cavity 205, as shown in FIG. 10C, and a complete exposure of the underneath portion of the middle section 301b. In a preferred embodiment, the cavity has the same length L as the middle section 301b.

At process 2040, silicon plasma etching followed by hydrogen annealing process at 1000-1200° C. is performed to transform the middle section 301b of the wire pattern into a substantially cylindrical shape by mass transportation around its periphery body. This hydrogen annealing process also eliminates the damages to the wire body caused by the silicon etching process. In an embodiment, the combination of the etching and annealing process provides a well controlled cylindrical radius r. In yet another embodiment, the cylindrical body has a length substantially equal to the length L defined for the middle section 301b. For example, the radius r is controlled within 2 nm to 25 nm. In another example, the length L is controlled to within a range of 5 nm to 50 nm. Namely, a cylindrical nanowire with a controlled radius r and length L is formed at the middle section 301b.

In one embodiment at the end of process 2030, referring to FIG. 10A, the resist patterns 351 and 352 are removed to reveal the whole device including the wire pattern 301 whereby the middle section 301b has been reshaped to a cylindrical nanowire in length L, a cavity 205 underneath the middle section 301b, buried oxide layer 201 and two remained portions of undercut structures 202a and 202c. FIG. 10B also schematically illustrates a cross-section view of the cylindrical shaped nanowire 301b with a radius r formed in the middle section of the wire pattern 301 and a gap between the nanowire and the etched oxide layer 201 due to the cavity 205.

Figure 11A:
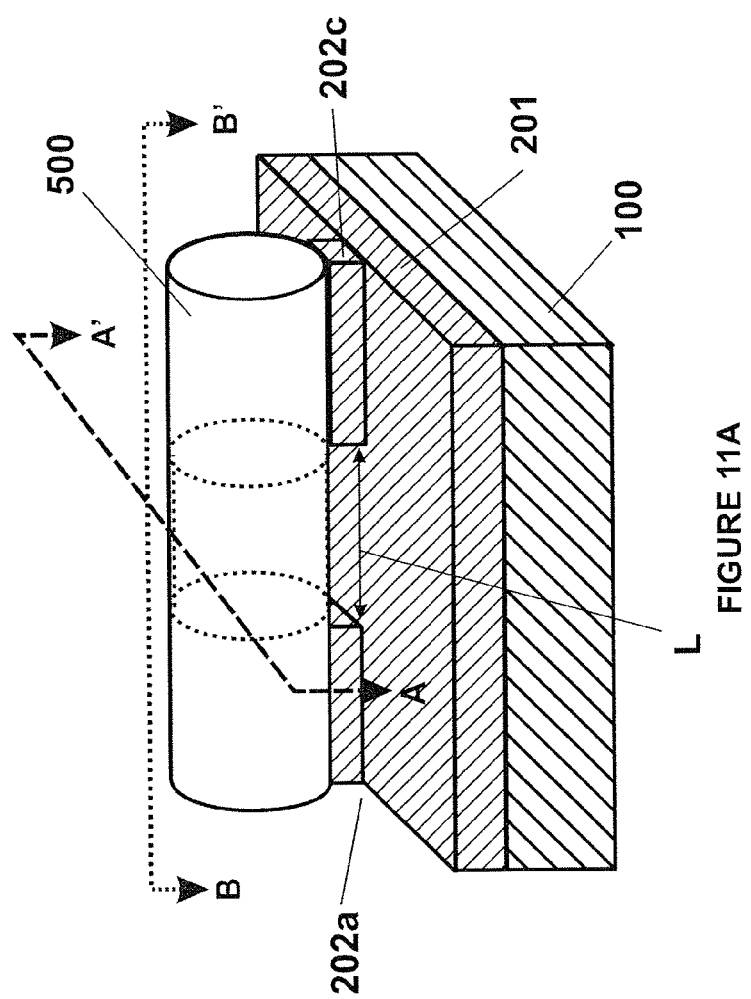
Figure 11B:
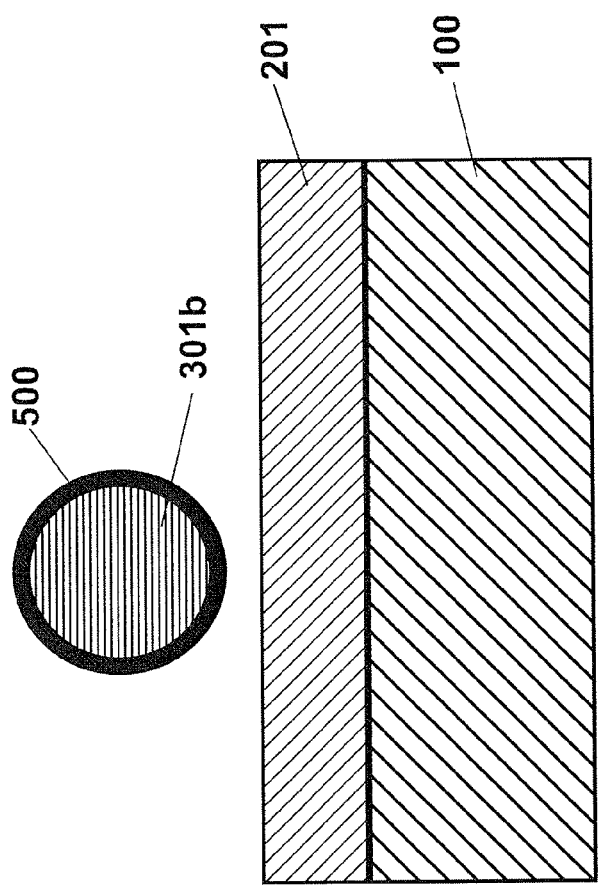
Figure 11C:
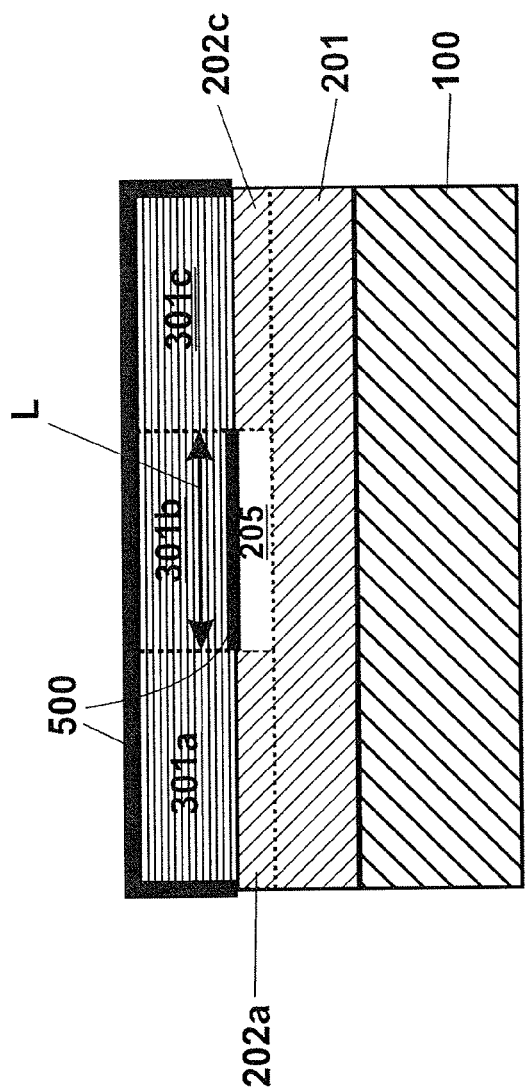

At process 2050, a gate dielectric layer is formed covering the wire pattern at least around the cylindrical nanowire. FIGS. 11A, 11B, and 11C show a simplified method for forming gate dielectric layer at least around the cylindrical nanowire for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications.

As shown in FIG. 11A, according to an embodiment of the present invention, a gate dielectric layer 500 is deposited specifically to cover the wire pattern 301. Conventionally gate dielectrics is formed of an oxide layer or a nitride layer through a thermal oxidation or thermal nitrification process. In the described embodiment, the deposition of the gate dielectric layer 500 is performed by chemical vapor deposition technique with good step coverage. In another embodiment, atomic layer deposition technique is applied to the dielectric deposition for achieving finer uniformity and/or thickness control.

In one embodiment, the gate dielectric layer 500 at least is formed all around the peripheral cylindrical nanowire 301b with the length L including its underneath surface in the cavity, as shown in FIG. 11B In another embodiment, the gate dielectric layer 500 has a thickness substantially less than the height of the cavity 205, leaving still a gap between the surface of the gate dielectric layer 500 and the etched oxide layer 201 (see FIG. 11C). For example, the thickness of the gate dielectric layer ranges from 1 nm to 3 nm. The material of the gate dielectric layer 500 is typically preferred to have a large bandgap and a high dielectric constant to provide excellent electrical insulation and to reduce the channel leakage current. In one example, the material of the gate dielectric layer 500 is metal oxide (e.g., aluminum oxide, tantalum oxide, titanium oxide, zirconium oxide, hafnium oxide, etc.).

Figure 12A:
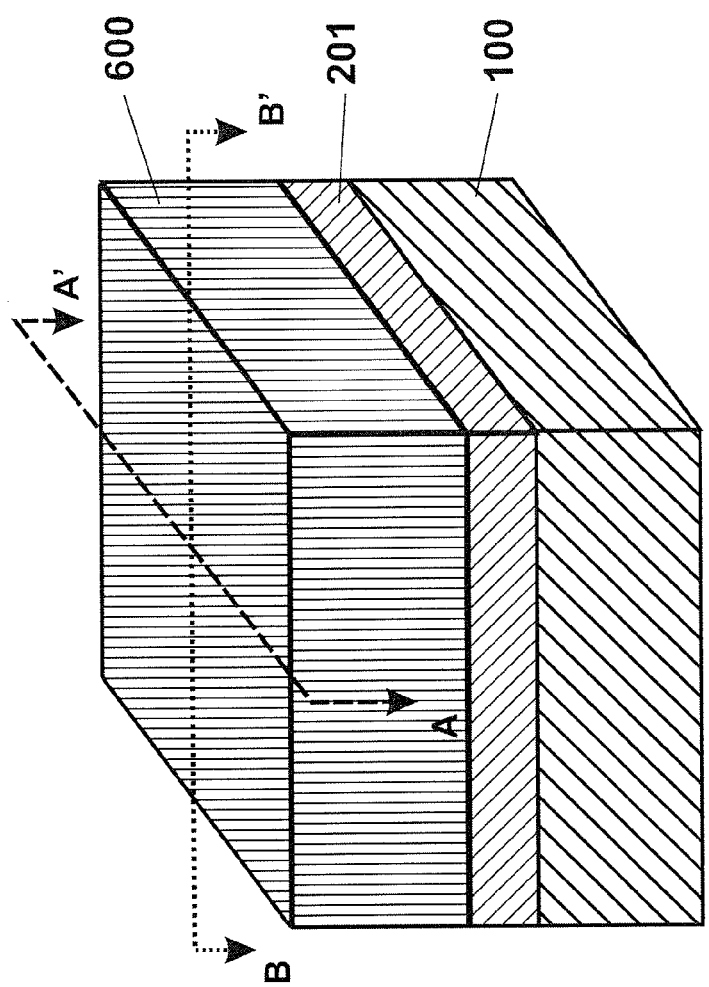
Figure 12B:
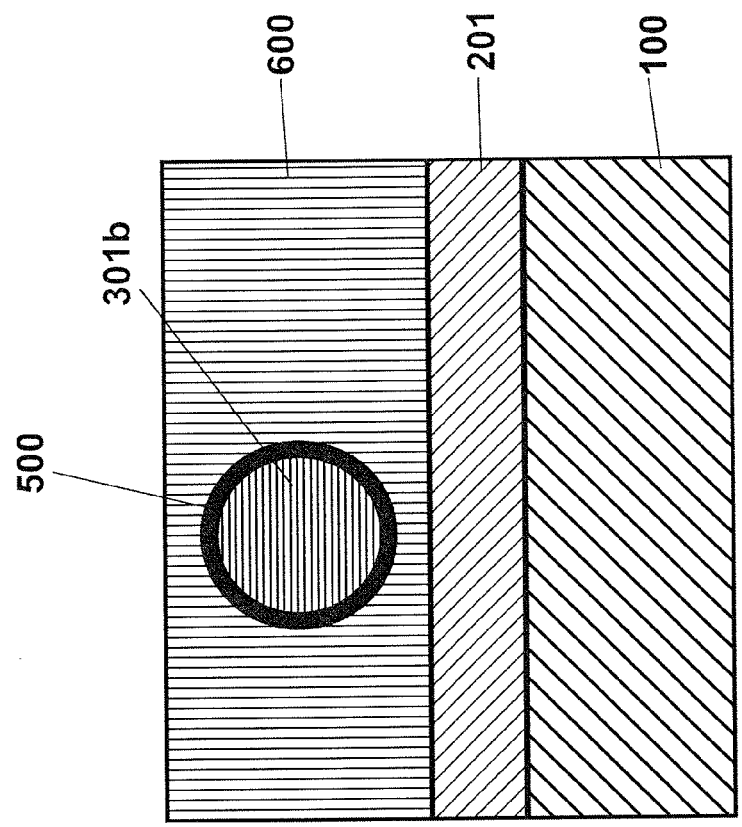
Figure 12C:
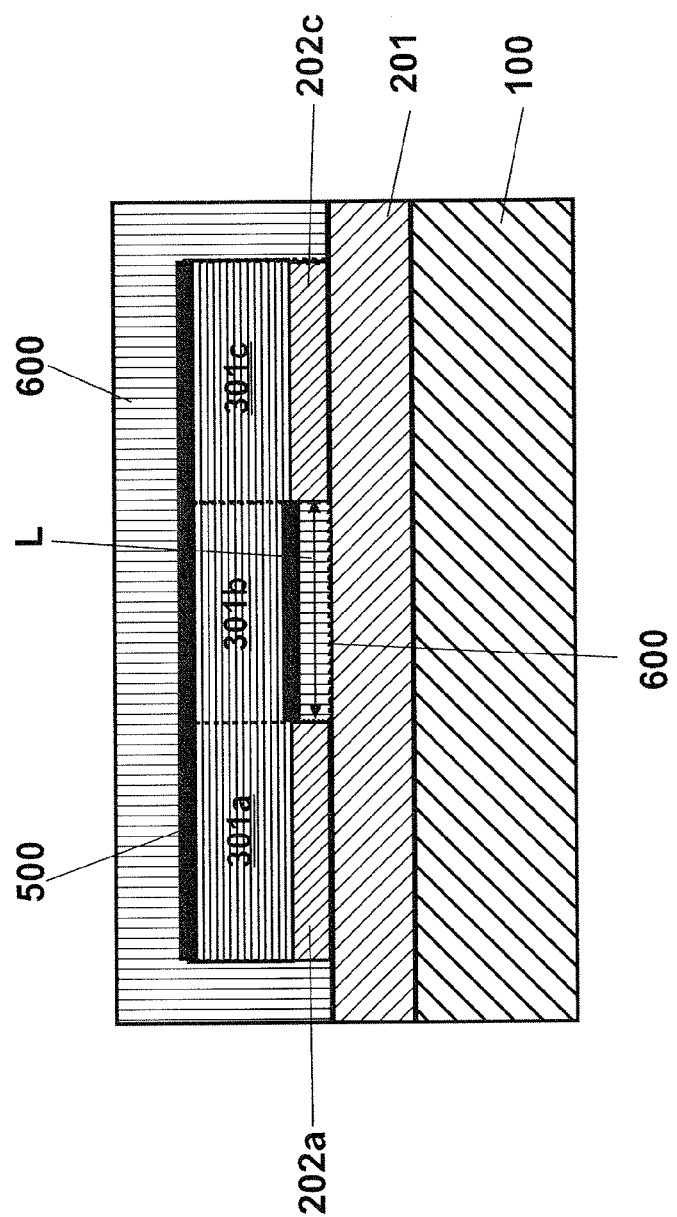

At process 2060, the gate conductive layer is overlaid. FIGS. 12A, 12B, and 12C show a simplified method for overlaying gate conductive layer for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications.

As shown in FIGS. 12A, 12B, and 12C, a conductive material layer 600 covers the wire pattern 301 (after the coating of the gate dielectric layer 500) and the revealed surface of etched oxide layer 201 including the undercut structures 202a and 202c and the cavity 205 underneath the added gate dielectric layer 500. Prior to the deposition of the conductive gate material 600, an etch-stop layer pattern is applied with the same registry as in process 2030 for defining the cylindrical nanowire 301b of wire pattern 301 and the region beyond the both sides thereof. This step defines a gate region which is co-centered with the cylindrical nanowire 301b with a lateral dimension of L along the direction of B-B' and extends beyond the both sides of the middle-section 301b in the direction A-A'. Preferably, according to an embodiment of the present invention, conductive gate material is deposited using CVD technique. In one example, a low pressure (LP) CVD is applied, which ensures the stacked conductive layer 600 filling any cavity and being able to entirely surround the cylindrical nanowire 301b with the thin gate dielectric layer 500 interposed. In another example, the conductive gate material is poly-silicon grown at the temperature of 600° C. to 800° C. with a thickness ranging from 100 nm to 500 nm and heavily doped to n-type impurity. In yet another example, the conductive gate material with a thickness of 10 nm to 200 nm is a metal layer grown by a LPCVD process.

Figure 13A:
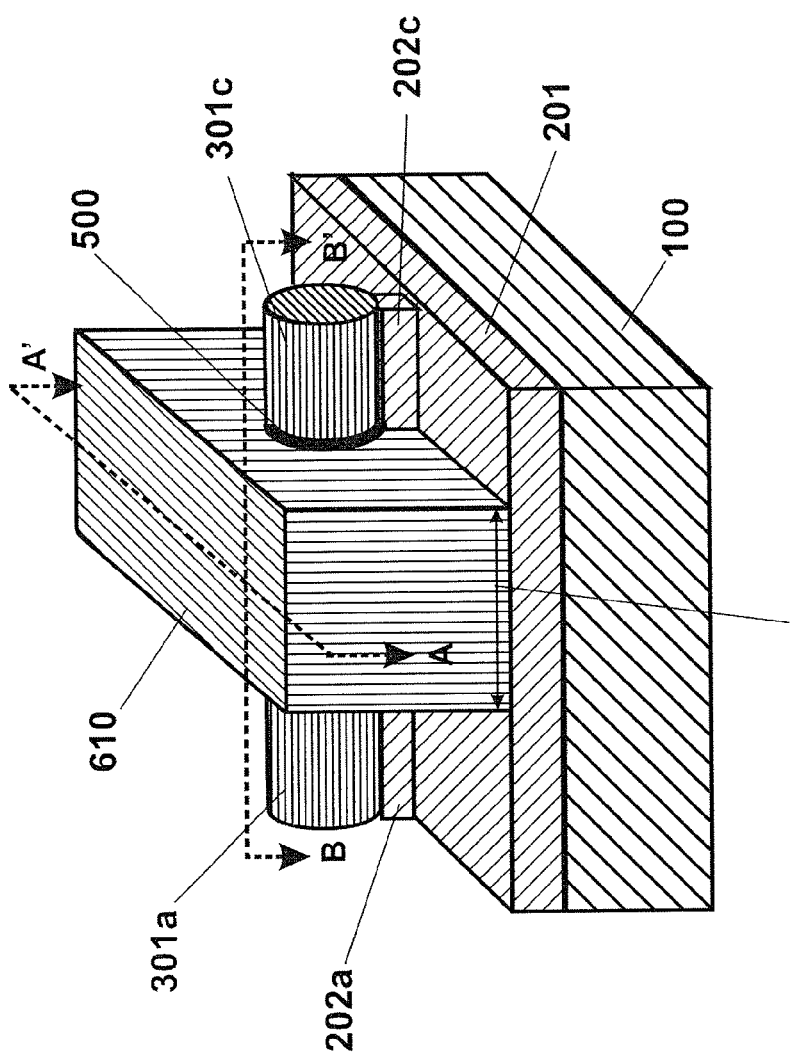
Figure 13B:
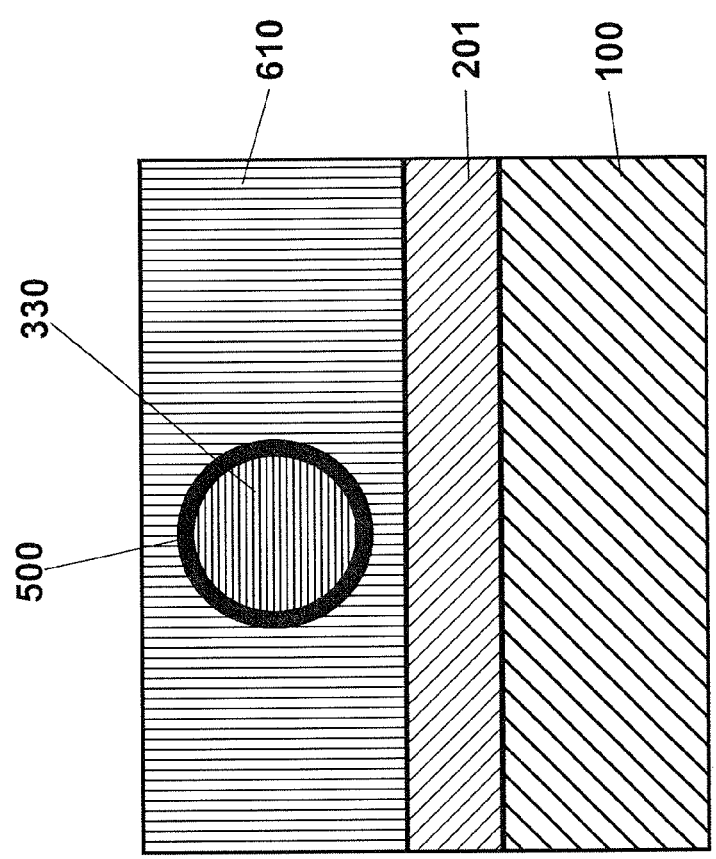
Figure 13C:
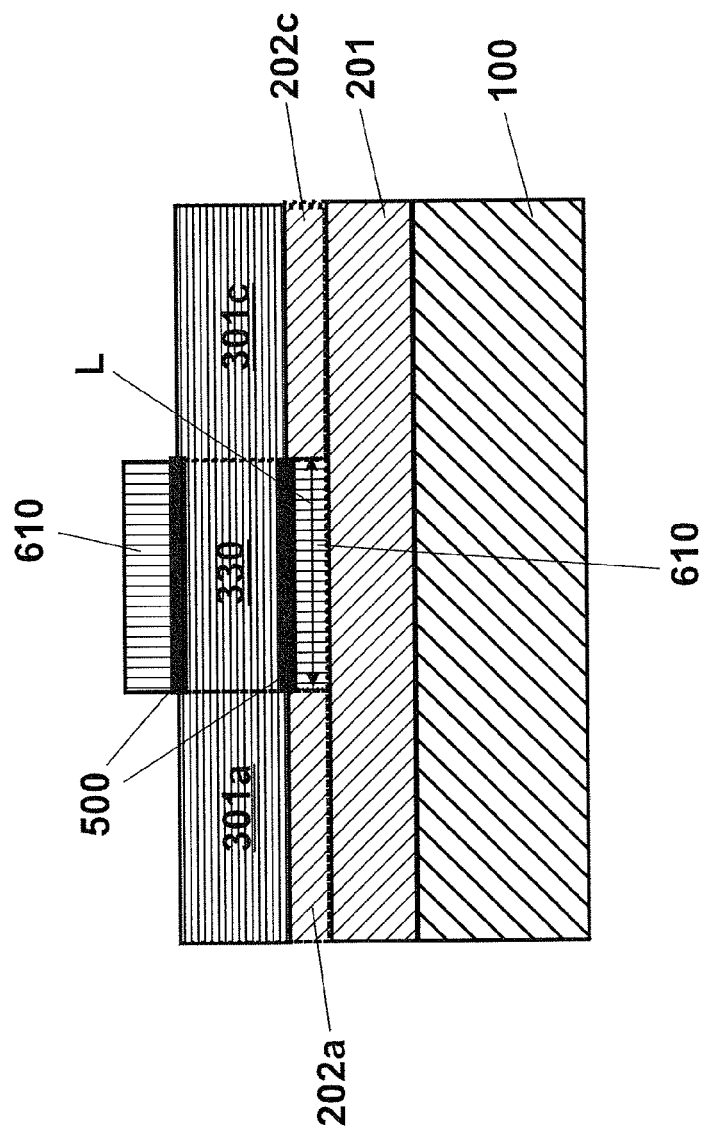

Now referring back to FIG. 6. At process 2070, a gate electrode is formed. FIGS. 13A, 13B, and 13C show a simplified method for forming a gate electrode surrounding the cylindrical nanowire channel and overlaying the buried oxide layer in a 2nd direction perpendicular to the 1st direction for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications. For example, the process is implemented in manufacturing the device 1000.

At process 2070, a resist layer pattern is aligned to apply on the same gate region defined at the process 2060. Then the conductive layer etching is performed to remove gate materials that are not covered by this resist layer pattern. The etching is stopped at the etch-stop layer placed in the process 2060 over the first end-section 301a and the second end-section 301c of the wire pattern 301. The resist layer is then stripped through phosphoric wet-etching. As the result, according to one embodiment of the present invention, as shown in FIGS. 13A, 13B, and 13C, a gate electrode 610 made of the conductive material 600 is formed at the lithography-defined gate region. The gate electrode 610 surrounds the cylindrical nanowire 301b with an interposed gate dielectric layer 500. In one embodiment, as shown in FIG. 13A, the gate electrode 610 is associated with a gate length of L along the wire pattern that is substantially equal to the length of the cylindrical nanowire 301b. In another embodiment, the gate electrode 610 is expanded along A-A' direction overlaying the etched oxide layer 201 while the wire pattern 301 vertically penetrates through thereof along B-B' direction in a state so that the gate dielectric layer 500 is interposed. In yet another embodiment, referring to FIGS. 13B and 13C, the formation of the gate electrode 610 naturally defines the channel region 330 for the device.

The channel region 330 is the cylindrical nanowire formed at process 2040 which is surrounded first by the gate dielectric layer 500 then by the gate electrode 610. In one example, the cylindrical nanowire channel 330 is made of silicon. The silicon nanowire pattern is formed from the SOI layer doped through the threshold-adjustment ion implantation.

Figure 14A:
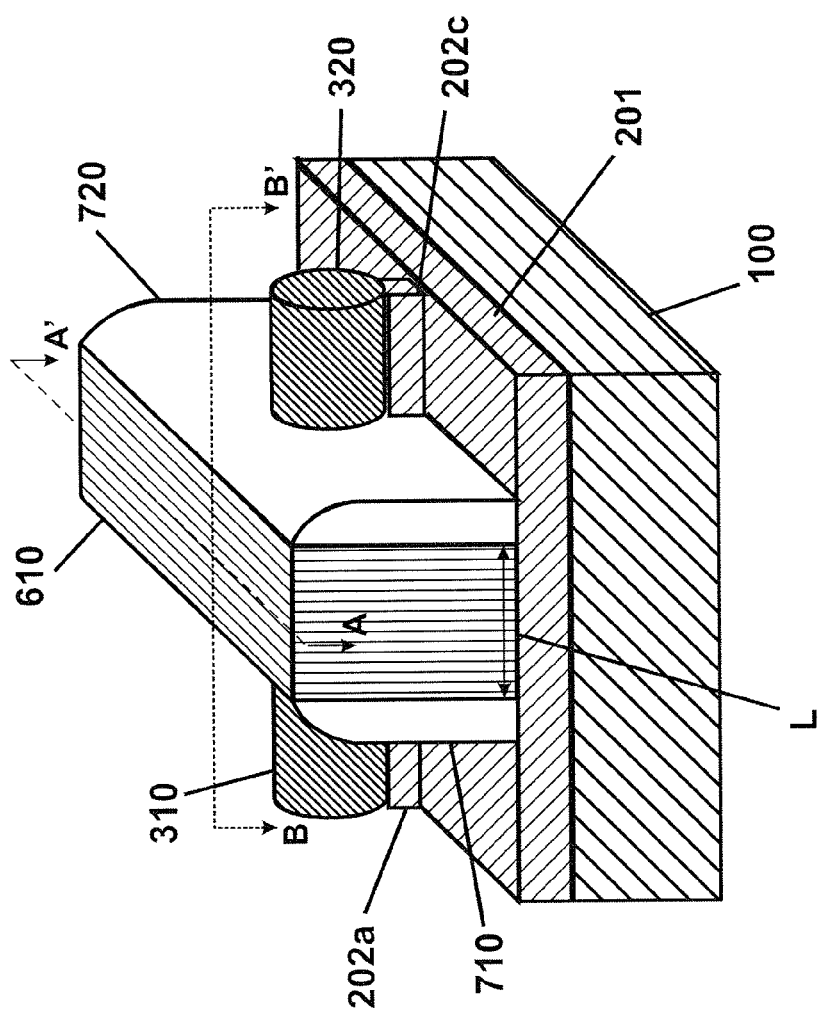
Figure 14B:
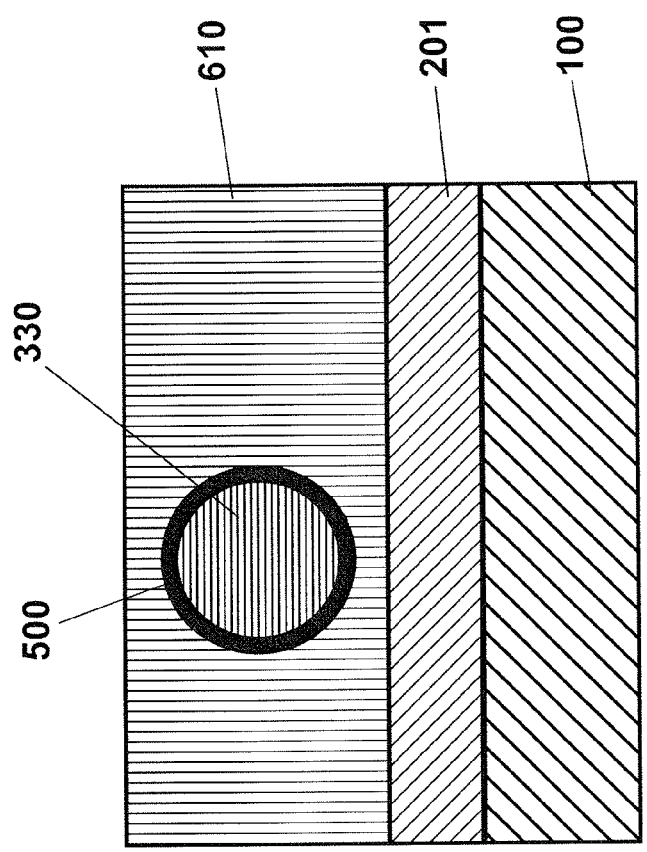
Figure 14C:
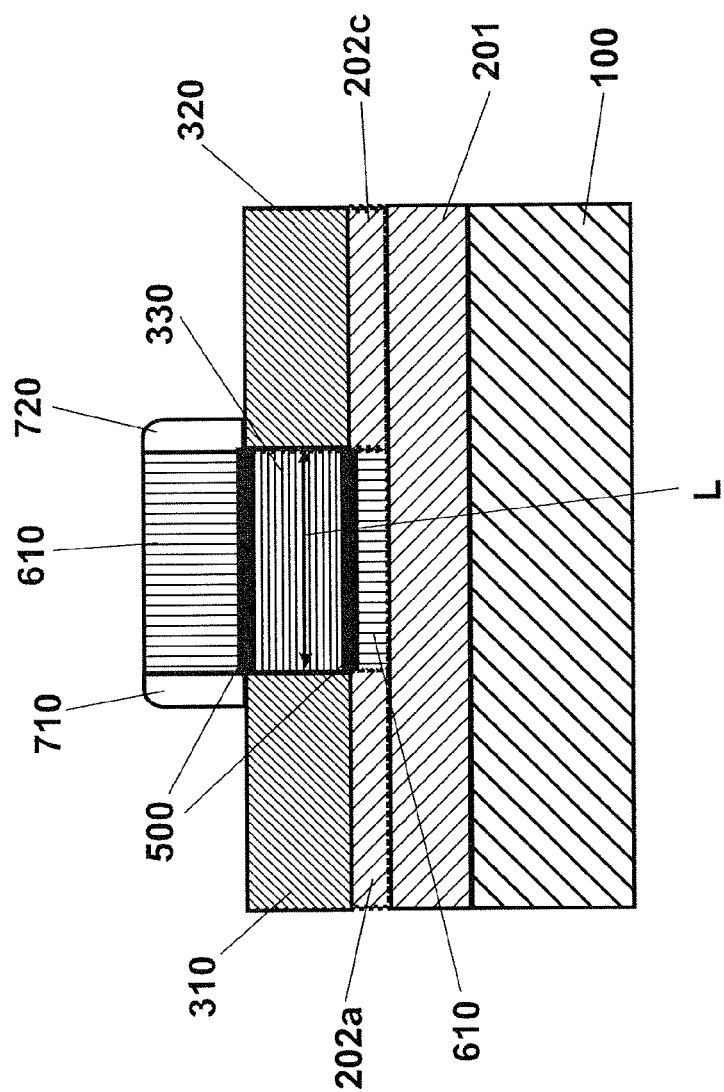

Referring back to FIG. 6, at process 2080, spacer regions between the gate electrode and the wire pattern are formed, thereby defining the source region and the drain region. FIGS. 14A, 14B, and 14C show a simplified method for forming spacer regions and defining the source and drain regions for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications.

At the end of the process 2070, as shown in FIG. 13A, the formation of the gate electrode 610 surrounded the channel region 330 reveals the two opposite end-sections 301a and 301c of the wire pattern 301. As a result, two circular intersection lines (only one is viewable in FIG. 13A) between the wire pattern 301 and the gate electrode 610. Along the peripheral intersection line, at least four materials or layers including the silicon in wire pattern 301, gate dielectric layer 500, etched oxide layer 201, and gate conductive layer 600 are partially in contact with each other. Referring to FIGS. 14A, in one embodiment at the process 2080, spacer regions 710 and 720 are formed to cover the areas around the two intersection lines. In another embodiment, the formation of the spacer regions 710 and 720 serves an electrical isolation and diffusion barrier functions between the conductive gate electrode and the wire pattern 301. In another embodiment, the spacer regions 710 and 720 also physically define the wire pattern section 301a and 301c beyond the two spacer regions 710 and 720 as the source region 310 and drain region 320, respectively.

As shown in FIGS. 14A and 14C, the spacer region 710 is in contact with the gate electrode 610, the source region 310, the gate dielectric layer 500 and the buried oxide layer 201 including part of the undercut structure 202a, the spacer region 720 is in contact with the gate electrode 610, the drain region 320, the gate dielectric layer 500 and the buried oxide layer 201 including part of the undercut structure 202c. In another embodiment, the spacer regions 710 and 720 are made of a dielectric material. In one example, it is an oxide-nitride-oxide (ONO) layer. Particularly, the ONO layer can be a sequential layer of silicon oxide, silicon nitride, and silicon oxide. In another example, the deposition of the spacer layer is performed through CVD, PVD, or ALD techniques. A patterned resist mask layer is usually to be applied prior to the spacer layer deposition and subsequently removed after the deposition.

At process 2090, the heavily doped source/drain regions are formed. FIGS. 14A, 14B, and 14C can also be used to illustrated a simplified method for forming the source and drain regions by heavily implanting the dopants with opposite polarity to the channel dopant for making device with a gate-all-around cylindrical nanowire architecture according to an embodiment of the present invention. Referring to FIGS. 14A and 14C, according to an embodiment of the present invention, the source region 310 is formed by heavily doping the wire pattern section 301a in the portion defined at process 2080. In the same described embodiment, the drain region 320 is formed by heavily doping the wire pattern section 301c in the portion defined at process 2080. In another embodiment, the dopant polarity of source and drain regions is opposite to the channel doping polarity which is set during the initial SOI wafer preparation at process 2010. For example, for an N-type finFET device the channel region 330 needs to be doped to n-type, thereby the source region 310 and the drain region 320 need to be heavily doped with p-type dopants by ion implantation. In another example, for a P-type finFET device the channel region 330 needs to be doped to p-type, thereby the source region 310 and the drain region 320 need to be heavily doped with n-type dopants by ion implantation. For each ion implantation process, relevant implantation mask is applied to corresponding areas/regions before the performance of implantation towards the source/drain region specifically. In one example, the $N^+$ S/D implant condition is: Specie $As^+$, energy 60 KeV, dosage $5.5 \times 10^{13}$ ions/$cm^2$, tilt 0. In another example, the $P^+$ S/D implant condition is: Specie $B^+$, energy 5 KeV, dosage $3.5 \times 10^{13}$ ions/$cm^2$, tilt 0.

Figure 15A:
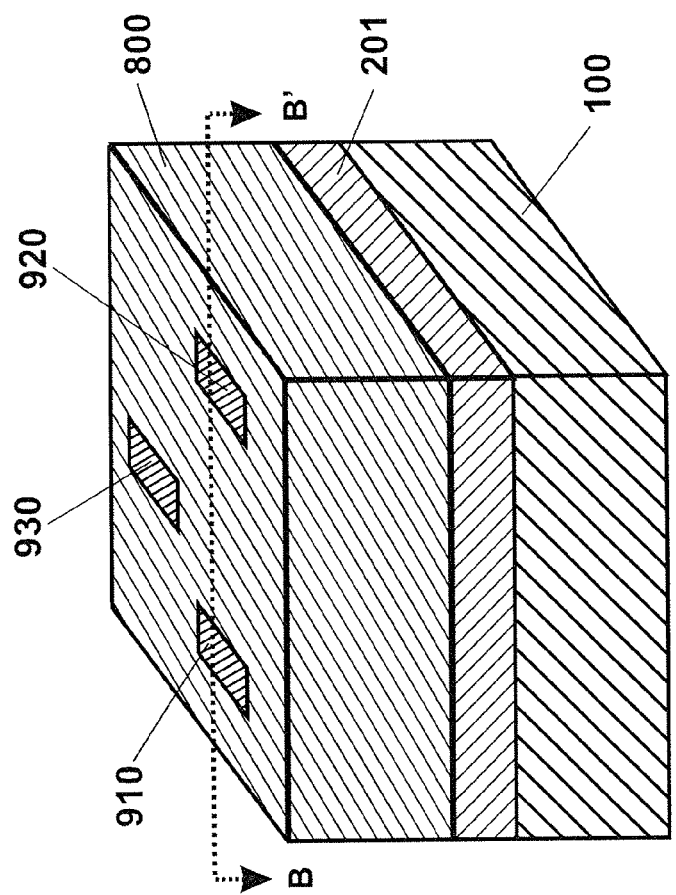
FIG. 15A is a simplified perspective view of an integrated circuit unit showing three contact pads for a gate-all-around cylindrical nanowire finFET device within an inner dielectric layer according to an embodiment of the present invention.
Figure 15B:
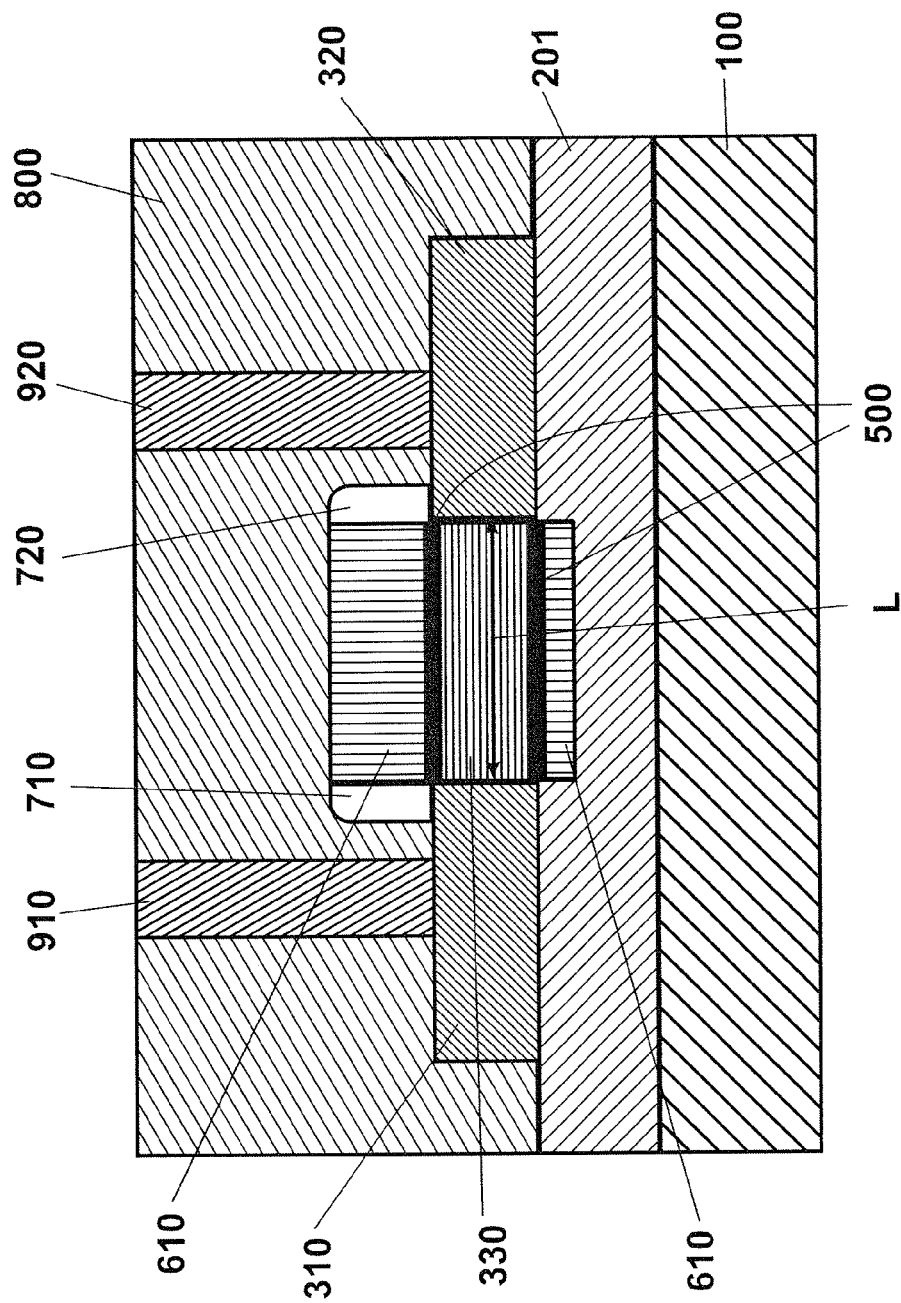
FIG. 15B is a simplified cross-sectional view cutting along the B-B' plane of FIG. 15A.

Now referring back to FIG. 6. At process 2100, an inner dielectric layer is formed. FIGS. 15A and 15B show a simplified method for forming inner dielectric layer for making device with a gate-all-around cylindrical nanowire architecture according to an embodiment of the present invention. These diagrams are merely examples, which should not unduly limit the scope of the claims. One of ordinary skill in the art would recognize many variations, alternatives, and modifications.

Referring to FIGS. 15A and 15B, according to an embodiment of the present invention, an inner dielectric layer 800 is formed to cover the gate electrode 610, the source region 310 and the drain region 320, spacer regions 710 and 720, and partially the etched oxide layer 201. In one example, the inner dielectric layer 800 is silicon oxynitride grown in a rapid thermal processor with $NH_3$, $N_2O$, or NO gas flow therein, followed by a BPSG layer with reflow process, then overlaid with an oxide layer planarized by a CMP process.

Now referring back to FIG. 6. At process 2110, one or more contacts are formed. FIGS. 15A and 15B also show a simplified method for forming contacts to the gate, source, and drain regions for making device with a gate-all-around cylindrical nanowire transistor according to an embodiment of the present invention. These diagrams are merely examples, which should not unduly limit the scope of the claims. One of ordinary skill in the art would recognize many variations, alternatives, and modifications.

As shown in FIGS. 15A and 15B, in one example, contact holes 910 and 920 is formed to expose the doped silicon wire pattern on the source region 310 and the drain region 320 respectively. In another example, a contact hole 930 similarly exposes the gate electrode 610 at a position not in the B-B' plane (not seen in FIG. 15B). In the contact holes, a diffusion barrier layer is formed to cover the bottom and the side surfaces of the holes 910, 920 and 930. For example, the diffusion barrier layer includes titanium (Ti) and Titanium Nitride (TiN) material. After contact holes are formed, the contact holes 910, 920, and 930 are filled by metal material including tungsten, forming the contacts to the source region 310, the drain region 320, and the gate electrode 610, respectively According to one embodiment, a method for fabricating a semiconductor device having a gate-all-around cylindrical nanowire architecture is provided. The method includes providing a first insulation layer on a wafer substrate and forming a semiconductor wire overlying the first insulation layer along a first direction. The semiconductor wire includes a first end section, a middle section, and a second end section. The method further includes forming an undercut structure of the first insulation layer beneath the semiconductor wire and removing the undercut structure selectively beneath the middle section to form a cavity having a first length and a first height. Additionally, the method includes forming a channel region by shaping the middle section above the cavity to a substantially cylindrical shape. The channel region is associated with a channel length substantially equal to the first length. The method further includes wrapping a second insulation layer around the cylindrical channel region. The second insulation layer has a thickness substantially less than the first height of the cavity. Moreover, the method includes depositing a conductive layer on the first insulation layer to at least cover the semiconductor wire including the cylindrical channel region surrounded by the second insulation layer and to fill the cavity beneath. The method includes further forming a gate region from the conductive layer along a second direction surrounding the cylindrical channel region including the filled cavity beneath. The second direction is substantially perpendicular to the first direction. The gate region is associated with a gate length along the first direction which is substantially equal to the first length. Furthermore, the method includes forming a source region in the first end section and forming a drain region in the second end section. For example, the method is illustrated by the method 2000.

According to another embodiment, a method of making a transistor with a gate surrounding a cylindrical nanowire channel includes providing an SOI substrate including an SOI layer, a buried oxide layer and a bottom substrate, and forming a wire pattern within the SOI layer on the buried oxide layer along a first direction. The wire pattern includes a first end section, a middle section, and a second end section. The method further includes forming an undercut structure of the buried oxide layer underneath the wire pattern and selectively removing the undercut structure underneath the middle-section to form a cavity having a first length and a first height. Additionally, the method includes forming a channel region by shaping the middle section above the cavity to a substantially cylindrical shape. The channel region is associated with a channel length substantially equal to the first length. The method further includes forming a gate dielectric layer at least around the cylindrical channel region. The gate dielectric layer has a thickness substantially less than the first height of the cavity. The method further includes depositing a conductive layer on the buried oxide layer to at least cover the wire pattern including the channel region surrounded by the gate dielectric layer and to fill the cavity underneath. Moreover, the method includes forming a gate region from the conductive layer along a second direction surrounding the cylindrical channel region including the filled cavity underneath. The second direction is substantially perpendicular to the first direction. The gate region is associated with a gate length along the first direction which is substantially equal to the first length Furthermore, the method includes forming a source region in the first end-section and a drain region in the second end-section. The method further includes forming a first spacer region and a second spacer region. The first spacer region is in contact with the gate region, the source region, the gate dielectric layer, and the buried oxide layer; and the second spacer region is in contact with the gate region, the drain region, the gate dielectric layer, and the buried oxide layer. For example, the method is implemented according to method 2000.

In still another embodiment, a method for forming a semiconductor devices includes providing a semiconductor layer overlying an insulator layer and forming an elongated semiconductor region in the semiconductor layer using an anisotropic semiconductor etching process. The method includes etching the insulating layer using an isotropic dielectric etching process, forming a mask to protect a first portion and a second portion of the elongated semiconductor region and expose a third portion of the elongated semiconductor region, and removing a portion of the insulator layer under the third portion of the elongated semiconductor region to form a void region. The method also includes forming a dielectric layer overlying the elongated semiconductor region and forming a conductive material overlying the dielectric layer over the elongated semiconductor region, the conductive material completely surrounding the third portion of the elongated semiconductor region. The method further includes patterning the conductive material.

In some embodiments, the method also includes using an isotropic dielectric etch process to form undercuts under the elongated semiconductor region. In another embodiment, the semiconductor layer overlying the insulator layer is provided providing on a silicon-on-insulator (SOI) substrate. In yet another embodiment, the method also includes thermal oxidation of the elongated semiconductor region and isotropic oxide etch to cause the elongated semiconductor region to have a rounded cross-section. In another embodiments, an isotropic dielectric etch is used for removing a portion of the insulator layer under the third portion of the semiconductor region. In a specific embodiment, a buffered oxide etchant (BOE) is used for removing a portion of the insulator layer under the third portion of the semiconductor region.

In some embodiments, the method also includes an $H_2$ annealing process for forming a cylindrical-shaped semiconductor region. In an embodiment, the $H_2$ annealing process is carried out at about 1000 to 1200° C. In another embodiment, the cylindrical-shaped semiconductor region has a diameter of from about 2 nm to about 25 nm. In another embodiment, forming the dielectric layer comprises forming a high-K dielectric layer. In an embodiment, forming the conductive material includes forming a polysilicon material. In another embodiment, the method also includes forming ONO (Oxide/Nitride/Oxide) spacers adjacent to the patterned conductive material.

Embodiments of the present invention has various advantages. Some embodiments of the present invention provide device having a gate architecture that surrounds entirely a cylindrical shaped channel region with only a thin gate high-k dielectric layer interposed. For example, the channel region of the device is characterized by a nano-scale cylindrical silicon wire forming a bridge structure from the source region to the drain region along the same wire pattern, and the gate region is formed substantially perpendicular toward the wire pattern on a buried oxide layer of an SOI substrate. The device is made by the processes according to some embodiments of the present invention and is controlled by essentially infinite number of gates surrounding the cylinder-shaped channel. The device having such a gate architecture possesses a much improved electrical integrity. The current leakage due to the corner effect of the conventional gate-all-around fin transistor is substantially reduced. The present invention demonstrates that the gate-all-around cylindrical nanowire FinFET device provides superior scaling capability with short-channel effects being suppressed and more stable gate control than the conventional multi-gate finFET device. Additionally, the present invention provides a fabrication process of the gate-all-around cylindrical nanowire finFET device characterized by its simplicity and full compatibility with conventional planar CMOS technology.

It is also understood that the examples and embodiments described herein are for illustrative purposes only and that various modifications or changes in light thereof will be suggested to persons skilled in the art and are to be included within the spirit and purview of this application and scope of the applied claims.

What is claimed is:

1. A semiconductor device comprising:
   a substrate;
   a first insulation layer overlaying the substrate;
   an elongated semiconductor region overlaying the first insulation layer along a first direction, the elongated semiconductor region including a first end section, a middle section, and a second end section;
   a source region being within the first end section;
   a drain region being within the second end section;
   a channel region being within the middle section, the channel region connecting the source region and the drain region, the channel region, the source region, and the drain region being characterized by a substantially cylindrical shape having a radius and a length, the source region and the drain region overlaying an undercut structure formed by a portion of the first insulation layer, the undercut structure having a width less than a width of the cylindrical shape, the undercut structure being absent underneath the channel region;
   a second insulation layer surrounding the cylindrical channel region; and
   a gate electrode overlaying the second insulation layer all around the channel region and overlaying the first insulation layer along a second direction, the second direction being substantially perpendicular to the first direction,
   wherein the channel region comprises a first dopant and the source/drain regions comprise a second dopant, the first dopant being characterized by a first polarity, the second dopant being characterized by a second polarity, the first polarity being opposite from the second polarity.

2. The device of claim 1 wherein the elongated semiconductor region comprises a material doped through threshold-adjustment ion implantation.

3. The device of claim 2 wherein the material includes silicon.

4. The device of claim 2 wherein the material includes SiGe mixture.

5. The device of claim 1 wherein each of the source and drain regions of the elongated semiconductor region overlays an undercut structure of the first insulation layer.

6. The device of claim 1 wherein the channel region is not directly in contact with the first insulation layer.

7. The device of claim 1 wherein the radius of the channel region ranges from 2 nm to 25 nm and the length of the channel region ranges from 5 nm to 50 nm.

8. The device of claim 1 wherein the first insulation layer comprises silicon oxide.

9. The device of claim 1 wherein the second insulator layer surrounding the cylindrical channel region has a nominal thickness ranging from 1 nm to 3 nm.

10. The device of claim 9 wherein the second insulation layer comprises at least one dielectric material of aluminum oxide, tantalum oxide, titanium oxide, zirconium oxide, or hafnium oxide.

11. The device of claim 1 wherein the gate electrode is characterized by a length in the first direction, the length being substantially equal to the length of the channel region.

12. The device of claim 11 wherein the gate electrode is electrically isolated from each of the source region and the drain region by an insulation spacer.

13. The device of claim 12 wherein the insulation spacer comprises an oxide/nitride/oxide (ONO) layer.

14. The device of claim 1 wherein the second dopant comprises an n-type impurity.

15. The semiconductor device of claim 1 wherein further comprising:
    a first contact hole directly above the cylindrical source region;
    a second contract hole directly above the cylindrical drain region; and
    a third contact hole offset from the cylindrical channel region.

16. A semiconductor device comprising:
    a substrate;
    a first insulation layer overlaying the substrate;
    an elongated semiconductor region overlaying the first insulation layer along a first direction, the elongated semiconductor region including a first end section, a middle section, and a second end section;
    a source region being within the first end section;
    a drain region being within the second end section;
    a channel region being within the middle section, the channel region connecting the source region and the drain region, the channel region, the source region, and the drain region being characterized by a substantially cylindrical shape having a radius and a length, the source region and the drain region overlaying an undercut structure formed by a portion of the first insulation layer, the undercut structure having a width less than a width of the cylindrical shape, the undercut structure being absent underneath the channel region;
    a second insulation layer surrounding the cylindrical channel region; and
    a gate electrode overlaying the second insulation layer all around the channel region and overlaying the first insulation layer along a second direction, the second direction being substantially perpendicular to the first direction,
    wherein the channel region comprises a first dopant and the source/drain regions comprise a second dopant, the first dopant and the second dopant being characterized by a same polarity, wherein a dopant concentration in the source/drain regions is higher than that in the channel region.

17. The semiconductor device of claim 16 wherein the first and second dopants comprise a p-type impurity.

18. The semiconductor device of claim 16 wherein the gate electrode is electrically isolated from each of the source region and the drain region by an insulation spacer, the insulation spacer comprising an oxide/nitride/oxide (ONO) layer.

19. The semiconductor device of claim 16 wherein the gate electrode comprises a metal material.

20. The semiconductor device of claim 16 wherein a current flows from the source region to the drain region across the channel region when a voltage is applied to the gate electrode.

21. The semiconductor device of claim 16 further comprising:
- a first contact hole directly above the cylindrical source region;
- a second contract hole directly above the cylindrical drain region; and
- a third contact hole offset from the cylindrical channel region.

* * * * *